US011721843B2

(12) United States Patent
Kong et al.

(10) Patent No.: US 11,721,843 B2
(45) Date of Patent: Aug. 8, 2023

(54) CAPACITOR ASSISTED BATTERY MODULES AND SYSTEMS

(71) Applicant: GM GLOBAL TECHNOLOGY OPERATIONS LLC, Detroit, MI (US)

(72) Inventors: Dewen Kong, Shanghai (CN); Xiaochao Que, Shanghai (CN); Dave G. Rich, Sterling Heights, MI (US); Si Chen, Shanghai (CN); Meiyuan Wu, Shanghai (CN); Haijing Liu, Shanghai (CN)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 707 days.

(21) Appl. No.: 16/779,780

(22) Filed: Feb. 3, 2020

(65) Prior Publication Data

US 2021/0151809 A1 May 20, 2021

(30) Foreign Application Priority Data

Nov. 15, 2019 (CN) .......................... 201911119453.5

(51) Int. Cl.
*H01M 10/42* (2006.01)
*H01M 10/48* (2006.01)
(Continued)

(52) U.S. Cl.
CPC .... *H01M 10/4264* (2013.01); *G01R 31/3835* (2019.01); *G01R 31/396* (2019.01);
(Continued)

(58) Field of Classification Search
CPC .......... H01M 10/4264; H01M 50/502; H01M 50/543; H01M 50/20; H01M 10/0525;
(Continued)

(56) References Cited

U.S. PATENT DOCUMENTS 8,481,203 B2 * 7/2013 Reis .................... H01M 50/209
429/188
9,040,182 B2    5/2015 Aihara et al.
(Continued)

FOREIGN PATENT DOCUMENTS

AU      2015101232 A4 *  10/2015  .......... H01M 10/425
CN       102696144 A       9/2012
(Continued)

OTHER PUBLICATIONS

Lu, Yong et al., U.S. Appl. No. 16/661,364, filed Oct. 23, 2019 entitled, "Electrochemical Cells Including Sulfur-Containing Capacitors," 61 pages.
(Continued)

*Primary Examiner* — Suresh Memula
(74) *Attorney, Agent, or Firm* — Harness, Dickey & Pierce, P.L.C.

(57) ABSTRACT

A capacitor-assisted battery module includes a housing, a positive terminal, a negative terminal, one or more capacitor-assisted battery cells and one or more first switches. The one or more capacitor-assisted battery cells are disposed in the housing and include one or more battery terminals and one or more capacitor terminals. The one or more battery terminals are connected to battery electrodes. The one or more capacitor terminals are connected to capacitor electrodes. At least one of the one or more battery terminals and the capacitor terminals is connected to the negative terminal. One or more first switches is configured to connect the one or more capacitor terminals to the positive terminal. An overall voltage of the capacitor assisted battery module is measured across the positive terminal and the negative terminal.

20 Claims, 21 Drawing Sheets

(51) Int. Cl.
*H01M 10/0525* (2010.01)
*H01G 11/24* (2013.01)
*H01G 11/58* (2013.01)
*H01G 11/46* (2013.01)
*G01R 31/396* (2019.01)
*G01R 31/3835* (2019.01)
*H01G 11/06* (2013.01)
*H01M 50/20* (2021.01)
*H01M 50/502* (2021.01)
*H01M 50/543* (2021.01)

(52) U.S. Cl.
CPC ............ *H01G 11/06* (2013.01); *H01G 11/24* (2013.01); *H01G 11/46* (2013.01); *H01G 11/58* (2013.01); *H01M 10/0525* (2013.01); *H01M 10/482* (2013.01); *H01M 50/20* (2021.01); *H01M 50/502* (2021.01); *H01M 50/543* (2021.01); *H01M 2010/4271* (2013.01); *H01M 2220/20* (2013.01)

(58) Field of Classification Search
CPC ....... H01M 10/482; H01M 2010/4271; H01M 2220/20; G01R 31/396; G01R 31/3835; H01G 11/06; H01G 11/24; H01G 11/46; H01G 11/58
USPC .......................................................... 320/166
See application file for complete search history.

(56) References Cited

U.S. PATENT DOCUMENTS

| | | | |
|---|---|---|---|
| 10,293,767 B2 | 5/2019 | Lee et al. | |
| 10,297,885 B2 | 5/2019 | Gayden et al. | |
| 10,826,139 B2 | 11/2020 | Rich et al. | |
| 10,994,632 B2 | 5/2021 | Kahnt et al. | |
| 11,069,488 B2 * | 7/2021 | Johnson | H01M 10/0525 |
| 11,171,365 B2 | 11/2021 | Li et al. | |
| 11,205,798 B2 | 12/2021 | Li et al. | |
| 11,233,407 B2 * | 1/2022 | Winger | B60L 50/64 |
| 2006/0127704 A1 * | 6/2006 | Raiser | H02J 7/345 |
| | | | 320/101 |
| 2011/0189533 A1 * | 8/2011 | Reis | H01M 50/512 |
| | | | 429/178 |
| 2012/0235473 A1 * | 9/2012 | Jiang | B60L 58/15 |
| | | | 307/9.1 |
| 2012/0237799 A1 * | 9/2012 | Jiang | B60L 50/64 |
| | | | 429/7 |
| 2013/0162216 A1 * | 6/2013 | Zhamu | H01G 11/10 |
| | | | 320/130 |
| 2015/0185291 A1 * | 7/2015 | Dao | G01R 31/396 |
| | | | 324/434 |
| 2016/0336593 A1 * | 11/2016 | Honda | H01M 4/525 |
| 2018/0034094 A1 | 2/2018 | Liu et al. | |
| 2018/0287164 A1 | 10/2018 | Liu et al. | |
| 2019/0061555 A1 | 2/2019 | Liu et al. | |
| 2019/0067754 A1 | 2/2019 | Gu et al. | |
| 2019/0074510 A1 | 3/2019 | Zhang et al. | |
| 2019/0157659 A1 | 5/2019 | Liu et al. | |
| 2019/0341648 A1 | 11/2019 | Wu et al. | |
| 2019/0372127 A1 | 12/2019 | Li et al. | |
| 2019/0372186 A1 * | 12/2019 | Kong | H01G 11/62 |
| 2020/0036053 A1 * | 1/2020 | Li | H01M 4/13 |
| 2020/0036070 A1 * | 1/2020 | Li | H01M 10/0525 |
| 2020/0126735 A1 * | 4/2020 | Johnson | H01G 11/86 |
| 2020/0127472 A1 * | 4/2020 | Kobayashi | H02J 7/0027 |
| 2020/0247253 A1 * | 8/2020 | Furukawa | B60L 53/22 |
| 2021/0012975 A1 * | 1/2021 | Su | H01M 50/414 |
| 2021/0021009 A1 * | 1/2021 | Li | H01G 11/26 |
| 2021/0028481 A1 * | 1/2021 | Hou | H01G 11/32 |
| 2021/0050157 A1 * | 2/2021 | Hou | H01M 4/366 |
| 2021/0065992 A1 * | 3/2021 | Lu | H01M 4/386 |
| 2021/0110979 A1 * | 4/2021 | Que | H01M 12/02 |
| 2021/0135224 A1 * | 5/2021 | Hou | H01G 11/30 |
| 2021/0151260 A1 | 5/2021 | Kong et al. | |
| 2022/0140422 A1 * | 5/2022 | Chen | H01G 11/06 |
| | | | 429/7 |
| 2022/0173429 A1 * | 6/2022 | Kimura | H01M 10/0525 |
| 2022/0181635 A1 * | 6/2022 | Kong | H01M 4/625 |
| 2022/0181710 A1 * | 6/2022 | Li | H01M 10/052 |

FOREIGN PATENT DOCUMENTS

| | | | | |
|---|---|---|---|---|
| CN | 109874358 A | | 6/2019 | |
| CN | 112820952 A | | 5/2021 | |
| CN | 113631809 A | * | 11/2021 | ............... B60K 6/28 |
| DE | 102020127444 A1 | | 5/2021 | |
| DE | 102020125133 A1 | * | 3/2022 | |
| EP | 2769868 A2 | * | 8/2014 | ............. B60K 23/08 |
| EP | 3206278 A1 | * | 8/2017 | ................ H02J 7/00 |
| WO | 2019200609 A1 | | 10/2019 | |
| WO | 2019204964 A1 | | 10/2019 | |
| WO | 2019218327 A1 | | 11/2019 | |

OTHER PUBLICATIONS

Kong, Dewen et al., U.S. Appl. No. 16/685,389, filed Nov. 15, 2019 entitled, "Capacitor-Assisted Gradient Electrodes," 71 pages.
First Office Action for Chinese Patent Application No. 201911119453.5 dated Apr. 26, 2023, with correspondence from China Patent Agent (H.K.) Ltd. summarizing Office Action; 9 pages.

* cited by examiner

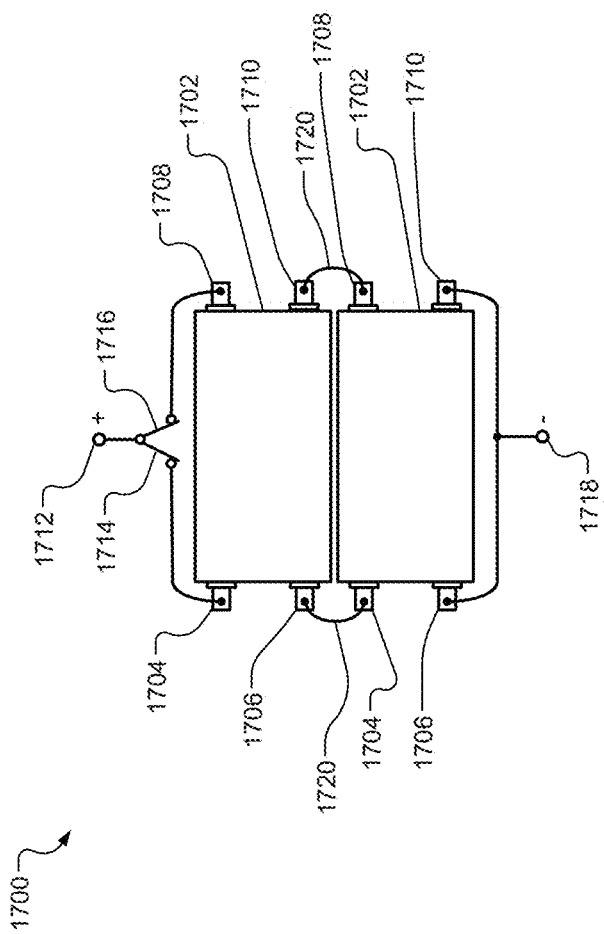

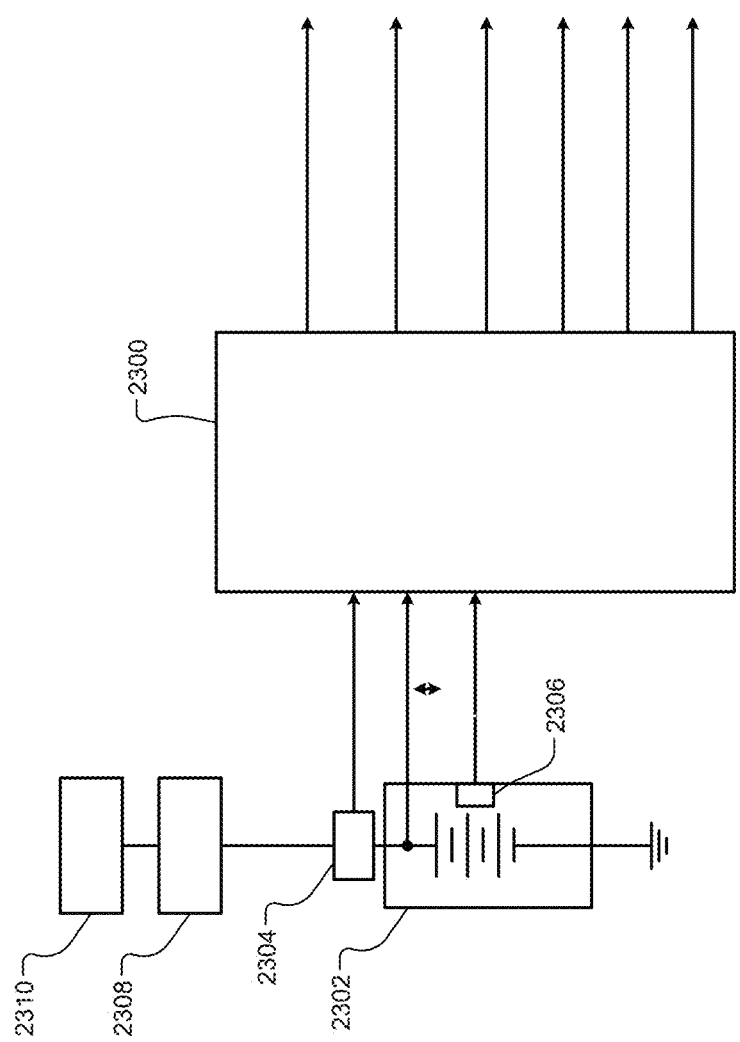

CAPACITOR ASSISTED BATTERY MODULES AND SYSTEMS

CROSS-REFERENCE TO RELATED APPLICATIONS

This application claims the benefit of and priority to Chinese Patent Application No. 201911119453.5, filed Nov. 15, 2019. The entire disclosure of the above application is incorporated herein by reference.

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates to vehicles and more particularly to battery systems of vehicles.

Traditional vehicles include an internal combustion engine that generates propulsion torque. Hybrid vehicles can include both an internal combustion engine and one or more electric motors for propulsion. The one or more electric motors are used to improve fuel efficiency. The electric motor and the internal combustion engine can be used in combination to achieve greater torque output than using only the internal combustion.

Example types of hybrid vehicles are parallel hybrid vehicles and series hybrid vehicles or mixture mode of parallel and series. In a parallel hybrid vehicle, an electric motor can work in parallel with an engine to combine power and range advantages of the engine with efficiency and regenerative braking advantages of the electric motor. In a series hybrid vehicle, an engine drives a generator to produce electricity for an electric motor, which drives a transmission. This allows the electric motor to assume some of the power responsibilities of the engine, which in turn allows for use of a smaller more fuel-efficient engine.

SUMMARY

This section provides a general summary of the disclosure, and is not a comprehensive disclosure of its full scope or all of its features.

A capacitor-assisted battery module is provided and includes a housing, a positive terminal, a negative terminal, one or more capacitor-assisted battery cells and one or more first switches. The one or more capacitor-assisted battery cells are disposed in the housing and include one or more battery terminals and one or more capacitor terminals. The one or more battery terminals are connected to battery electrodes. The one or more capacitor terminals are connected to capacitor electrodes. At least one of the one or more battery terminals and the capacitor terminals is connected to the negative terminal. One or more first switches is configured to connect the one or more capacitor terminals to the positive terminal. An overall voltage of the capacitor assisted battery module is measured across the positive terminal and the negative terminal.

In other features, the one or more capacitor-assisted battery cells includes: a lithium ion battery cathode terminal; a lithium ion capacitor cathode terminal; a lithium ion battery anode terminal; and a lithium ion capacitor anode terminal. The one or more battery terminals include the lithium ion battery cathode terminal and the lithium ion battery anode terminal. The one or more capacitor terminals include the lithium ion capacitor cathode terminal and the lithium ion capacitor anode terminal. The one or more first switches include a first switch and a second switch. The first switch is configured to connect the lithium ion battery cathode terminal to the positive terminal. The second switch is configured to connect the lithium ion capacitor cathode terminal to the positive terminal.

In other features, the one or more capacitor assisted battery cells includes capacitor-assisted battery cells connected in series.

In other features, the one or more capacitor assisted battery cells includes: a second lithium ion battery cathode terminal; a second lithium ion capacitor cathode terminal; a second lithium ion battery anode terminal; and a second lithium ion capacitor anode terminal. The one or more battery terminals include the second lithium ion battery cathode terminal and the second lithium ion battery anode terminal. The one or more capacitor terminals include the second lithium ion capacitor cathode terminal and the lithium ion capacitor anode terminal. The one or more first switches include a third switch and a fourth switch. The third switch is configured to connect the second lithium ion battery cathode terminal to the positive terminal. The fourth switch is configured to connect the second lithium ion capacitor cathode terminal to the positive terminal.

In other features, the one or more capacitor assisted battery cells includes: a lithium ion battery cathode terminal; a lithium ion capacitor cathode terminal; the one or more battery terminals include the lithium ion battery cathode terminal; the one or more capacitor terminals include the lithium ion capacitor cathode terminal; the one or more first switches include a first switch; and the first switch is configured to connect the lithium ion capacitor cathode terminal to the positive terminal.

In other features, the one or more capacitor-assisted battery cells includes: a second lithium ion battery cathode terminal; a second lithium ion capacitor cathode terminal; the one or more battery terminals include the second lithium ion battery cathode terminal; the one or more capacitor terminals include the second lithium ion capacitor cathode terminal; the one or more first switches include a second switch; and the second switch is configured to connect the second lithium ion capacitor cathode terminal to the positive terminal.

In other features, each of the one or more capacitor-assisted battery cells includes an anode terminal shared by battery anode electrodes and capacitor anode electrodes of that capacitor assisted battery cell.

In other features, each of the one or more capacitor-assisted battery cells includes only a single anode terminal.

In other features, the one or more one or more capacitor-assisted battery cells includes a liquid organic electrolyte.

In other features, the one or more capacitor assisted battery cells include a solid-state battery cell. The solid-state battery cell includes a solid-state electrolyte.

In other features, the one or more one or more capacitor assisted battery cells includes a hybrid type cell. The hybrid type cell includes a semi-liquid electrolyte.

In other features, the capacitor assisted battery module further includes one or more non-capacitor-assisted battery cells.

In other features, the capacitor-assisted battery module further includes a capacitor-assisted battery terminal. The one or more battery terminals and the one or more capacitor terminals are cathode terminals. The one or more battery terminals and the capacitor-assisted battery terminal are on a first side of the housing. The one or more capacitor terminals is on a second side of the housing opposite the first side.

In other features, the one or more capacitor-assisted battery cells include electrodes connected to the capacitor-assisted battery terminal. Electrodes connected to the capacitor-assisted battery terminal include a metal oxide and graphene.

In other features, the capacitor-assisted battery module further includes a capacitor-assisted battery terminal. The one or more battery terminals and the one or more capacitor terminals are cathode terminals. The one or more battery terminals and the one or more capacitor terminals are on a first side of the housing. The capacitor assisted battery terminal is on a second side of the housing.

In other features, the one or more capacitor-assisted battery cells include electrodes connected to the capacitor assisted battery terminal. Electrodes connected to the capacitor-assisted battery terminal include a metal oxide and graphene.

In other features, a modular dynamically allocated capacity storage system includes: one or more battery modules including the capacitor-assisted battery module; one or more source terminals supplying power at a first voltage potential to a first load; and one or more second switches. The one or more battery modules are configured to supply power to the one or more source terminals based on one or more states of the one or more second switches.

In other features, the modular dynamically allocated capacity storage system further includes the one or more battery modules, a first source terminal and a second source terminal. The one or more battery modules including a first series of battery modules and a second series of battery modules. The first series of battery modules includes the capacitor-assisted battery module. The first source terminal supplies power at the first voltage potential to the first load. The second source terminal supplies power at a second voltage potential to a second load. The one or more second switches includes a first switch and a second switch. The first series of battery modules are configured to supply power to the first source terminal based on a state of the first switch. The second series of battery modules is configured to supply power to the second source terminal based on a state of the second switch.

In other features, the modular dynamically allocated capacity storage system further includes: a sensing module sensing module configured to determine a parameter of the capacitor assisted battery module and generate a status signal; and a control module configured to receive a power request signal, and based on the power request signal, the parameter and an operating mode, adjust a state of at least one of the one or more second switches.

In other features, the one or more battery modules includes capacitor-assisted battery modules and non-capacitor-assisted battery modules.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 1 a sample plot illustrating starting lighting ignition (SLI) cold cranking voltage reduction over time at −30° C. for a lithium ion battery (LIB) cell and a capacitor-assisted battery (CAB) cell after 3060 cycles at 55° C.

FIG. 17 is a functional block diagram of an example of a CAB module including dual CAB cells implemented as a solid-state battery CAB cell.

FIG. 23 is a functional block diagram of an example battery monitoring (or management) system (BMS) module for a battery pack.

Corresponding reference numerals indicate corresponding parts throughout the several views of the drawings.

DETAILED DESCRIPTION

Figure 25:
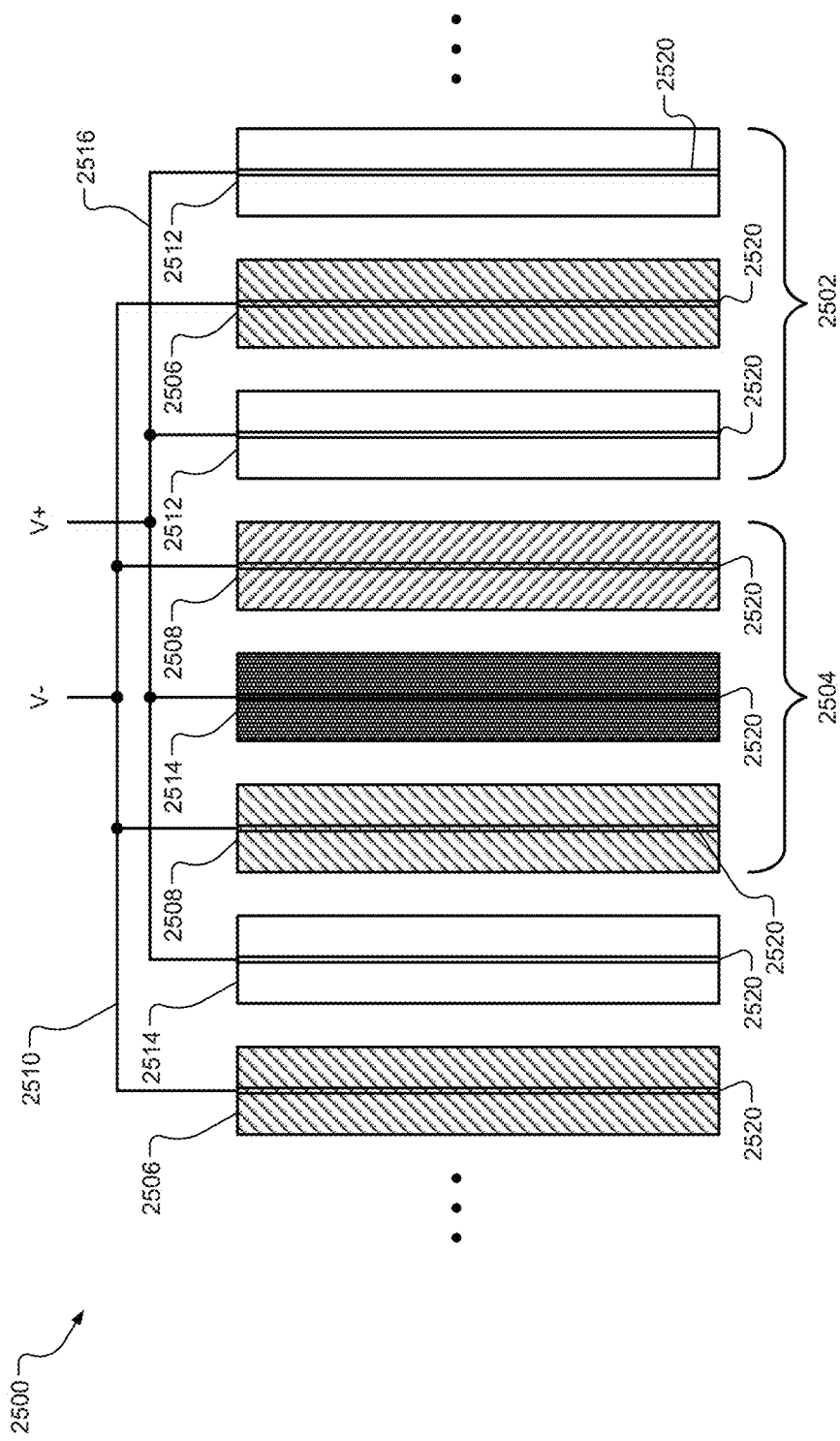
FIG. 25 is a block schematic diagram of an electrode architecture of an example of a CAB cell.

To minimize use of lead in a vehicle, lead acid batteries may be replaced with other types of batteries, such as lithium ion batteries and/or capacitor-assisted batteries (CABs). A capacitor-assisted battery may include lithium ion battery (LIB) electrodes and lithium ion capacitor (LIC) electrodes. An example of a CAB cell is shown in FIG. 25. Some CABs include LIB cathodes formed of lithium nickel manganese cobalt oxide (NMC), LIB and LIC anodes formed of graphite, LIC cathodes formed of activated carbon (AC), separator and electrolyte with liquid solvents and lithium salt(s). A CAB when disposed under a hood of a vehicle that has an internal combustion engine can experience temperatures of, for example 45-75° C. At these temperatures, volumes of cells of the CAB can increase (referred to as "swelling"), charge capacity of the cells can decrease, and durability of the cells can degrade due to side reactions between AC electrodes and electrolyte solvents.

Figure 1:
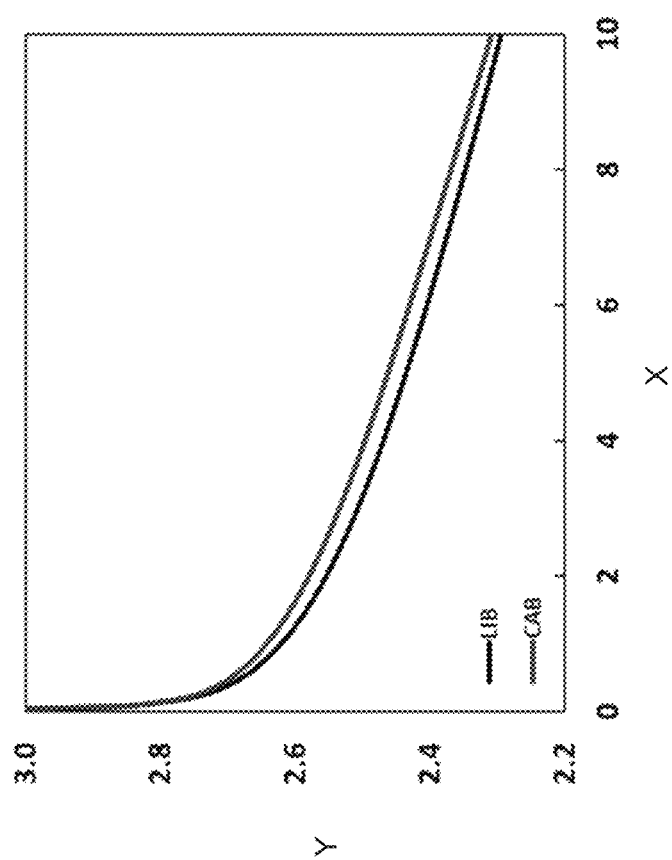
Figure 3:
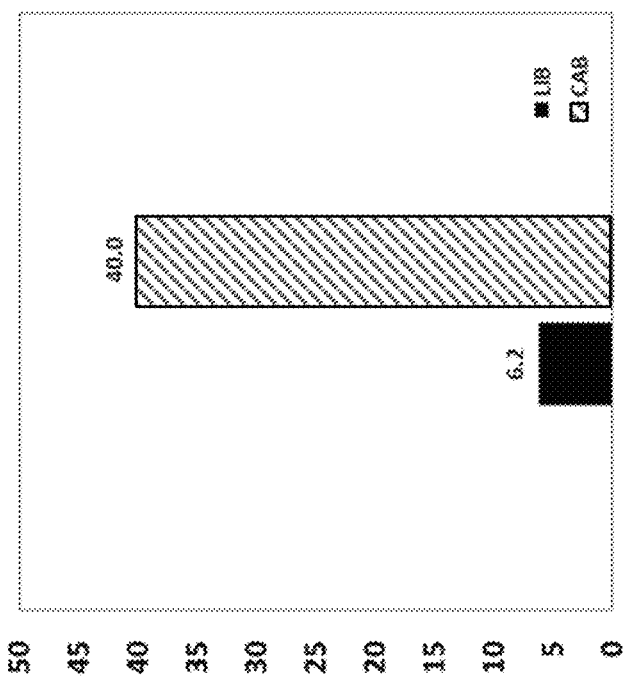
FIG. 3 is a plot illustrating volume swelling ratios for LIB cell and CAB cell at 55° C. after 3060 cycles.
Figure 2:
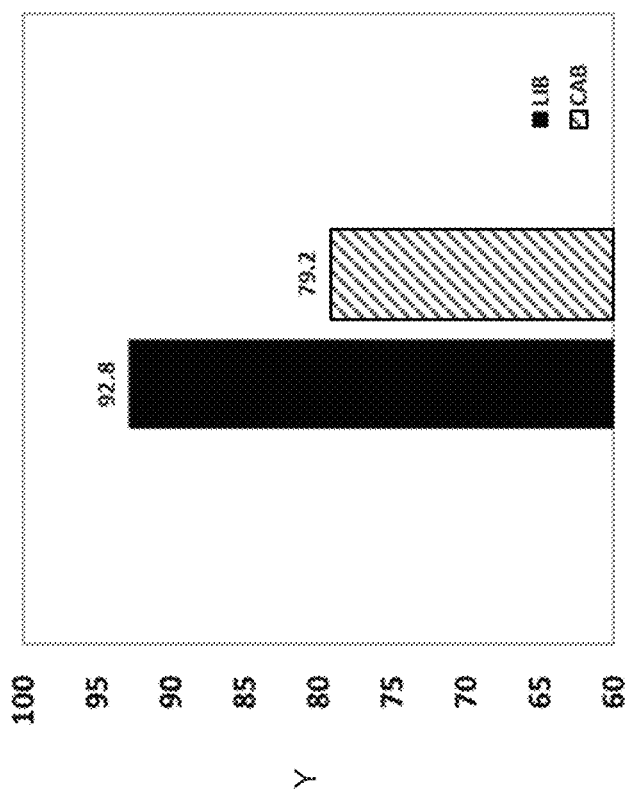
FIG. 2 is a plot illustrating capacity retention for LIB cell and CAB cell at 55° C. after 3060 cycles.

FIG. 1 shows a sample plot of SLI cold cranking voltage reduction over time at −30° C. for a LIB cell and a CAB cell after 3060 cycles at 55° C. The x-axis is time and the y-axis is cold cranking voltage. During each of the cycles the LIB cell and the CAB cell are charged from a state of charge (SOC) of 60% to 80% and discharged from a SOC of 80% to 60%. The CAB cell includes NMC cathodes. FIG. 2 shows a plot of capacity retention (y-axis) for the LIB cell and the CAB cell after 3060 cycles at 55° C. illustrating that the CAB cell has a lower capacity retention than the LIB cell due to swelling and degraded functionality. FIG. 3 shows a plot of volume swelling ratios 9y-axis) for the LIB cell and the CAB cell at 55° C. after 3060 cycles illustrating that the CAB cell experiences more swelling than the LIB cell. The swelling ratios are determined based on an original cell volume and a cell volume after a predetermined number of cycles.

Figure 4:
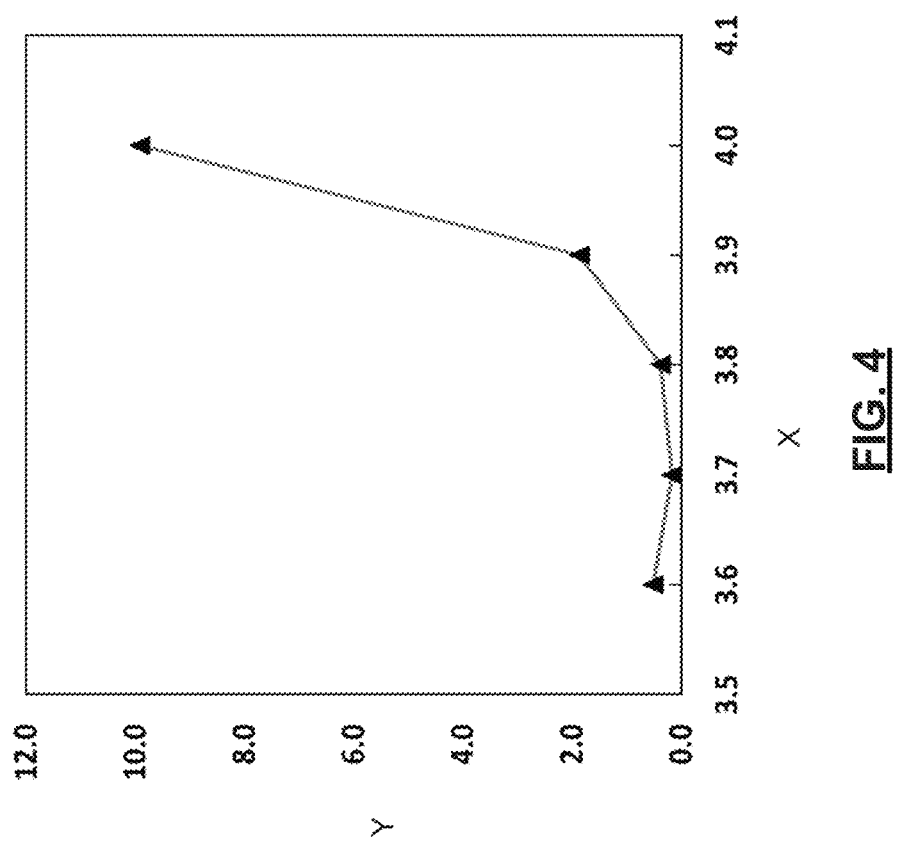
FIG. 4 is a plot of a swelling ratio versus storage voltage for a CAB cell at 45° C.

FIG. 4 shows a plot of a swelling ratio (y-axis) versus storage voltage (x-axis) for a CAB module at 45° C. The data in this plot is after 48 hours storage at 45° C. As can be seen from the plot, the higher the stored voltage the higher the swelling ratio and the more the swelling. The amount of swelling substantially increases for stored voltages greater than 3.9V. LIC cathodes formed of activated carbon can experience accelerated side reactions with solvents at high cell voltages (voltages greater than 3.9V), which lead to swelling, increased direct current resistance, and shortage of effective electrolyte in LIC.

To solve these issues, various battery arrangements including NMC based CAB cells with expensive AC materials have been tested. These battery arrangements have limited functionality and a complex electrolyte formulation with multiple additives. For at least these reasons, the stated battery arrangements have limited usage in under-hood applications.

Examples are set forth herein that include CAB modules having low voltage architecture, which provide high power output. System control techniques are also set forth for separately adjusting operational voltage and output power allocation of battery cells and capacitor cells of the CAB modules based on vehicle operating mode. The examples enable use of CAB cells in vehicle under-hood applications and other applications while allowing for battery and capacitor electrodes to be formed of various different chemical compositions including NMC, lithium nickel manganese oxide (LNMO), lithium manganese oxide (LMO), lithium titanium oxide (LTO), graphite, activated carbon, and other compounds and/or elements. The CAB modules experience minimal swelling and have improved state of charge and capacity retention and enhanced durability in high temperature (e.g., temperatures greater than 45° C.) applications.

The disclosed examples provide improved fuel economy, for example, by providing electrical boost power during a boost mode to quickly increase speed on an engine. The examples are also applicable to vehicle low voltage stop start systems and micro battery-assisted system (OAS) and because of increased cell high temperature durability aid in reducing warranty costs.

Modular dynamically allocated capacity storage systems (MODACSs) MODACSs and corresponding operations are disclosed herein. Each of the MODACS includes one or more CAB modules and may include one or more non-CAB modules, where each of the CAB modules includes capacitor electrodes and each of the non-CAB modules does not include capacitor electrodes. A MODACS may be implemented as a single battery having a corresponding housing with a negative (or ground reference) terminal and multiple source terminals. Each of the source terminals of a MODACS may have a preset direct current (DC) voltage (e.g., 12 volts (V), 24V, 36V, 48V, etc.) and may supply (or discharge) current or receive current during charging. As an example, the MODACS may include a single 48V source terminal, a first 12V source terminal and a second 12V source terminal.

Each of the MODACS includes one or more CAB cells and may include one or more non-CAB cells and a MODACS control module. The MODACS control module may be attached to, implemented in or be connected externally to the housing of the MODACS. The MODACS control module may be implemented partially or fully at the housing or at a remote location. As an example, the MODACS control module may be implemented as a control module within a vehicle and/or as part of a vehicle control module.

The housing may include switches and battery monitoring (or management) system (BMS) modules. The switches and BMS modules may be connected to and/or implemented separate from the CAB and non-CAB cells (hereinafter referred to as "cells"). The MODACS control module controls operating states of the switches to connect selected ones of the cells to the source terminals based on information from the BMSs. Any number of the cells, CAB modules and non-CAB modules may be selected and connected to each of the source terminals. The same or different cells, CAB modules and non-CAB modules may be connected to each of the source terminals at any moment in time. As further described below, the cells, CAB modules and non-CAB modules may be connected: in series and/or in parallel; in different connected configurations; and may be organized into blocks, packs, and/or groups. Each block may include one or more cells, which may be connected in series and/or in parallel. Each pack may include one or more blocks, which may be connected in series and/or in parallel. Each group may include one or more packs, which may be connected in series and/or in parallel. The groups may be connected in series and/or in parallel. Each of the BMS modules may be assigned to one or more cells, one or more blocks, one or more packs, and/or one or more groups and monitor corresponding parameters, such as voltages, temperatures, current levels, SOXs, instantaneous power and/or current limits, short-term power and/or current limits, and/or continuous power and/or current limits.

The acronym "SOX" refers to a state of charge (SOC), a state of health (SOH), and/or a state of function (SOF). The SOC of a cell, CAB module and/or non-CAB module may refer to the voltage, current and/or amount of available power stored in the cell, CAB module and/or non-CAB module. The SOH of a cell, CAB module and/or non-CAB module may refer to: the age (or operating hours); whether there is a short circuit; temperatures, voltages, and/or current levels supplied to or sourced from the cell, CAB module and/or non-CAB module during certain operating conditions; and/or other parameters describing the health of the cell, CAB module and/or non-CAB module. The SOF of a cell, CAB module and/or non-CAB module may refer to a current temperature, voltage, and/or current level supplied to or sourced from the cell, CAB module and/or non-CAB module, and/or other parameters describing a current functional state of the cell, CAB module and/or non-CAB module.

Instantaneous power and current limits may refer to power and current limits for a short period of time (e.g., less than 2 seconds). Short term power and current limits may refer to power and current limits for an intermediate length of time (e.g., 2-3 seconds). Continuous power and current limits refer to power and current limits for an extended period of time (e.g., periods greater than 3 seconds).

A MODACS control module controls the states of the switches to connect the cells to the source terminals while satisfying target and/or requested voltages, currents and power capacities. The MODACS control module and/or a vehicle control module may set the target and/or requested voltages, currents and power capacities, for example, based on a mode of operation. A MODACS may operate in different operating modes, which correspond to vehicle operating modes, as described below. The MODACS operating modes may include, for example, a regenerative mode, a boost mode, an autostart mode, or other MODACS charge or discharge modes. The vehicle operating modes may include an electric vehicle launch mode, an engine start mode, an engine assist mode, an opportunity charging mode, a deceleration fuel cut-off (DFCO) regenerative mode, an electric vehicle regenerative mode (e.g., a generator DFCO regenerative mode or a brake regenerative mode), an electric vehicle cruise mode, and/or other vehicle operating mode. Additional vehicle operating modes are described below. Each of the vehicle operating modes corresponds to one of the MODACS modes. The stated modes are further described below.

The implementations disclosed herein may be applied to fully electric vehicles, battery electric vehicles (BEVs), hybrid electric vehicles including plug-in hybrid electric vehicles (PHEVs), partially or fully autonomous vehicles, and other types of vehicles.

Example embodiments will now be described more fully with reference to the accompanying drawings.

Figure 5:
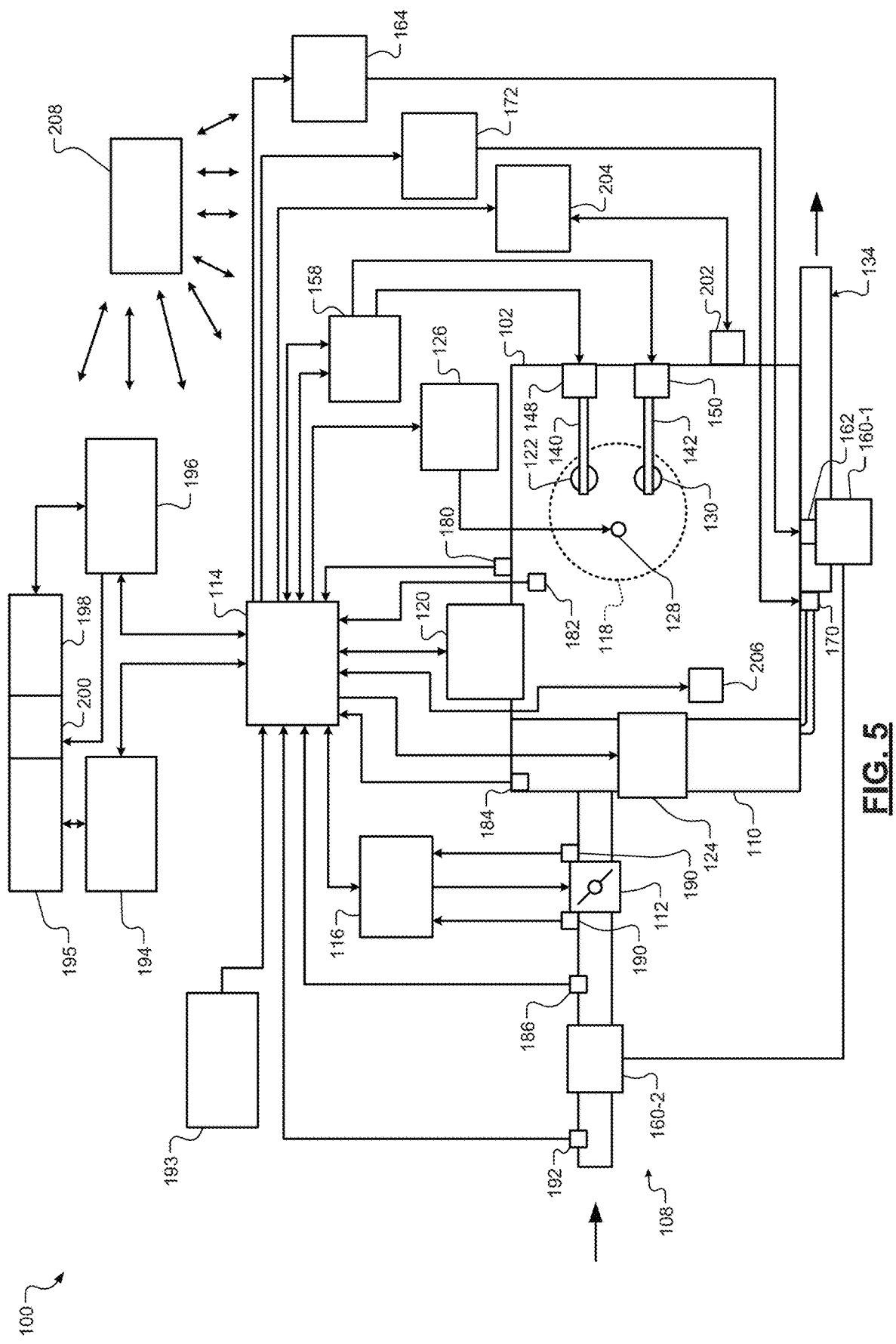
FIG. 5 is a functional block diagram of an example vehicle control system including a modular dynamically allocated capacity storage system (MODACS).

Referring now to FIG. 5, a functional block diagram of an example powertrain system 100 is presented. The powertrain system 100 of a vehicle includes an engine 102 that combusts an air/fuel mixture to produce torque. The vehicle may be non-autonomous, partially autonomous or fully autonomous.

Air is drawn into the engine 102 through an intake system 108. The intake system 108 may include an intake manifold 110 and a throttle valve 112. For example only, the throttle valve 112 may include a butterfly valve having a rotatable blade. An engine (or vehicle) control module (ECM) 114 controls a throttle actuator module 116, and the throttle actuator module 116 regulates opening of the throttle valve 112 to control airflow into the intake manifold 110.

Air from the intake manifold 110 is drawn into cylinders of the engine 102. While the engine 102 may include any number of cylinders, for illustration purposes a single representative cylinder 118 is shown. The ECM 114 may instruct a cylinder actuator module 120 to selectively deactivate some of the cylinders under some circumstances, which may improve fuel efficiency.

The engine 102 may operate using a four-stroke cycle or another suitable engine cycle. The four strokes of a four-stroke cycle, described below, will be referred to as the intake stroke, the compression stroke, the combustion stroke, and the exhaust stroke. During each revolution of a crankshaft (not shown), two of the four strokes occur within the cylinder 118. Therefore, two crankshaft revolutions are necessary for the cylinder 118 to experience all four of the strokes. For four-stroke engines, one engine cycle may correspond to two crankshaft revolutions.

When the cylinder 118 is activated, air from the intake manifold 110 is drawn into the cylinder 118 through an intake valve 122 during the intake stroke. The ECM 114 controls a fuel actuator module 124, which regulates fuel injection to achieve a desired air/fuel ratio. Fuel may be injected into the intake manifold 110 at a central location or at multiple locations, such as near the intake valve 122 of each of the cylinders. In various implementations (not shown), fuel may be injected directly into the cylinders or into mixing chambers/ports associated with the cylinders. The fuel actuator module 124 may halt injection of fuel to cylinders that are deactivated.

The injected fuel mixes with air and creates an air/fuel mixture in the cylinder 118. During the compression stroke, a piston (not shown) within the cylinder 118 compresses the air/fuel mixture. The engine 102 may be a compression-ignition engine, in which case compression causes ignition of the air/fuel mixture. Alternatively, the engine 102 may be a spark-ignition engine, in which case a spark actuator module 126 energizes a spark plug 128 in the cylinder 118 based on a signal from the ECM 114, which ignites the air/fuel mixture. The engine 102 may be a homogenous charge compression ignition (HCCI) engine that performs both compression ignition and spark ignition. The timing of the spark may be specified relative to the time when the piston is at its topmost position, which will be referred to as top dead center (TDC).

The spark actuator module 126 may be controlled by a timing signal specifying how far before or after TDC to generate the spark. Because piston position is directly related to crankshaft rotation, operation of the spark actuator module 126 may be synchronized with the position of the crankshaft. The spark actuator module 126 may disable provision of spark to deactivated cylinders or provide spark to deactivated cylinders.

During the combustion stroke, the combustion of the air/fuel mixture drives the piston down, thereby driving the crankshaft. The combustion stroke may be defined as the time between the piston reaching TDC and the time when the piston returns to a bottom most position, which will be referred to as bottom dead center (BDC). During the exhaust stroke, the piston begins moving up from BDC and expels the byproducts of combustion through an exhaust valve 130. The byproducts of combustion are exhausted from the vehicle via an exhaust system 134.

The intake valve 122 may be controlled by an intake camshaft 140, while the exhaust valve 130 may be controlled by an exhaust camshaft 142. In various implementations, multiple intake camshafts (including the intake camshaft 140) may control multiple intake valves (including the intake valve 122) for the cylinder 118 and/or may control the intake valves (including the intake valve 122) of multiple banks of cylinders (including the cylinder 118). Similarly, multiple exhaust camshafts (including the exhaust camshaft 142) may control multiple exhaust valves for the cylinder 118 and/or may control exhaust valves (including the exhaust valve 130) for multiple banks of cylinders (including the cylinder 118). While camshaft-based valve actuation is shown and has been discussed, camless valve actuators may be implemented. While separate intake and exhaust camshafts are shown, one camshaft having lobes for both the intake and exhaust valves may be used.

The cylinder actuator module 120 may deactivate the cylinder 118 by disabling opening of the intake valve 122 and/or the exhaust valve 130. The time when the intake valve 122 is opened may be varied with respect to piston TDC by an intake cam phaser 148. The time when the exhaust valve 130 is opened may be varied with respect to piston TDC by an exhaust cam phaser 150. A phaser actuator module 158 may control the intake cam phaser 148 and the exhaust cam phaser 150 based on signals from the ECM 114. In various implementations, cam phasing may be omitted. Variable valve lift (not shown) may also be controlled by the phaser actuator module 158. In various other implementations, the intake valve 122 and/or the exhaust valve 130 may be controlled by actuators other than a camshaft, such as electromechanical actuators, electrohydraulic actuators, electromagnetic actuators, etc.

The engine 102 may include zero, one, or more than one boost device that provides pressurized air to the intake manifold 110. For example, FIG. 5 shows a turbocharger including a turbocharger turbine 160-1 that is driven by exhaust gases flowing through the exhaust system 134. A supercharger is another type of boost device.

The turbocharger also includes a turbocharger compressor 160-2 that is driven by the turbocharger turbine 160-1 and that compresses air leading into the throttle valve 112. A wastegate (WG) 162 controls exhaust flow through and bypassing the turbocharger turbine 160-1. Wastegates can also be referred to as (turbocharger) turbine bypass valves. The wastegate 162 may allow exhaust to bypass the turbocharger turbine 160-1 to reduce intake air compression provided by the turbocharger. The ECM 114 may control the turbocharger via a wastegate actuator module 164. The wastegate actuator module 164 may modulate the boost of the turbocharger by controlling an opening of the wastegate 162.

A cooler (e.g., a charge air cooler or an intercooler) may dissipate some of the heat contained in the compressed air charge, which may be generated as the air is compressed. Although shown separated for purposes of illustration, the turbocharger turbine 160-1 and the turbocharger compressor 160-2 may be mechanically linked to each other, placing intake air in close proximity to hot exhaust. The compressed air charge may absorb heat from components of the exhaust system 134.

The engine 102 may include an exhaust gas recirculation (EGR) valve 170, which selectively redirects exhaust gas back to the intake manifold 110. The EGR valve 170 may receive exhaust gas from upstream of the turbocharger turbine 160-1 in the exhaust system 134. The EGR valve 170 may be controlled by an EGR actuator module 172.

Crankshaft position may be measured using a crankshaft position sensor 180. An engine speed may be determined based on the crankshaft position measured using the crankshaft position sensor 180. A temperature of engine coolant may be measured using an engine coolant temperature (ECT) sensor 182. The ECT sensor 182 may be located within the engine 102 or at other locations where the coolant is circulated, such as a radiator (not shown).

A pressure within the intake manifold 110 may be measured using a manifold absolute pressure (MAP) sensor 184. In various implementations, engine vacuum, which is the difference between ambient air pressure and the pressure within the intake manifold 110, may be measured. A mass flow rate of air flowing into the intake manifold 110 may be measured using a mass air flow (MAF) sensor 186. In various implementations, the MAF sensor 186 may be located in a housing that also includes the throttle valve 112.

Position of the throttle valve 112 may be measured using one or more throttle position sensors (TPS) 190. A temperature of air being drawn into the engine 102 may be measured using an intake air temperature (IAT) sensor 192. One or more other sensors 193 may also be implemented. The other sensors 193 include an accelerator pedal position (APP) sensor, a brake pedal position (BPP) sensor, may include a clutch pedal position (CPP) sensor (e.g., in the case of a manual transmission), and may include one or more other types of sensors. An APP sensor measures a position of an accelerator pedal within a passenger cabin of the vehicle. A BPP sensor measures a position of a brake pedal within a passenger cabin of the vehicle. A CPP sensor measures a position of a clutch pedal within the passenger cabin of the vehicle. The other sensors 193 may also include one or more acceleration sensors that measure longitudinal (e.g., fore/aft) acceleration of the vehicle and latitudinal acceleration of the vehicle. An accelerometer is an example type of acceleration sensor, although other types of acceleration sensors may be used. The ECM 114 may use signals from the sensors to make control decisions for the engine 102.

The ECM 114 may communicate with a transmission control module 194, for example, to coordinate engine operation with gear shifts in a transmission 195. The ECM 114 may communicate with a hybrid control module 196, for example, to coordinate operation of the engine 102 and an electric motor 198. While the example of one electric motor is provided, multiple electric motors may be implemented. The electric motor 198 may be a permanent magnet electric motor or another suitable type of electric motor that outputs voltage based on back electromagnetic force (EMF) when free spinning, such as a direct current (DC) electric motor or a synchronous electric motor. In various implementations, various functions of the ECM 114, the transmission control module 194, and the hybrid control module 196 may be integrated into one or more modules.

Each system that varies an engine parameter may be referred to as an engine actuator. Each engine actuator has an associated actuator value. For example, the throttle actuator module 116 may be referred to as an engine actuator, and the throttle opening area may be referred to as the actuator value. In the example of FIG. 5, the throttle actuator module 116 achieves the throttle opening area by adjusting an angle of the blade of the throttle valve 112.

The spark actuator module 126 may also be referred to as an engine actuator, while the corresponding actuator value may be the amount of spark advance relative to cylinder TDC. Other engine actuators may include the cylinder actuator module 120, the fuel actuator module 124, the phaser actuator module 158, the wastegate actuator module 164, and the EGR actuator module 172. For these engine actuators, the actuator values may correspond to a cylinder activation/deactivation sequence, fueling rate, intake and exhaust cam phaser angles, target wastegate opening, and EGR valve opening, respectively.

The ECM 114 may control the actuator values in order to cause the engine 102 to output torque based on a torque request. The ECM 114 may determine the torque request, for example, based on one or more driver inputs, such as an APP, a BPP, a CPP, and/or one or more other suitable driver inputs. The ECM 114 may determine the torque request, for example, using one or more functions or lookup tables that relate the driver input(s) to torque requests.

Under some circumstances, the hybrid control module 196 controls the electric motor 198 to output torque, for example, to supplement engine torque output. The hybrid control module 196 may also control the electric motor 198 to output torque for vehicle propulsion at times when the engine 102 is shut down.

The hybrid control module 196 applies electrical power from a MODACS 208 to the electric motor 198 to cause the electric motor 198 to output positive torque. The MODACS 208 is further described below. The electric motor 198 may output torque, for example, to an input shaft of the transmission 195, to an output shaft of the transmission 195, or to another component. A clutch 200 may be implemented to couple the electric motor 198 to the transmission 195 and to decouple the electric motor 198 from the transmission 195. One or more gearing devices may be implemented between an output of the electric motor 198 and an input of the transmission 195 to provide one or more predetermined gear ratios between rotation of the electric motor 198 and rotation of the input of the transmission 195. In various implementations, the electric motor 198 may be omitted.

The ECM 114 starts the engine 102 via a starter motor 202. The ECM 114 or another suitable module of the vehicle engages the starter motor 202 with the engine 102 for an engine startup event. For example only, the ECM 114 may engage the starter motor 202 with the engine 102 when a key ON command is received. A driver may input a key ON command, for example, via actuating one or more ignition keys, buttons, and/or switches of the vehicle or of a key fob of the vehicle. The starter motor 202 may engage a flywheel coupled to the crankshaft or one or more other suitable components that drive rotation of the crankshaft.

The ECM 114 may also start the engine in response to an auto-start command during an auto-stop/start event or to an engine start command for a sailing event. Auto-stop/start events include shutting down the engine 102 while the vehicle is stopped, the driver has depressed the brake pedal, and the driver has not input a key OFF command. An auto-start command may be generated while the engine 102 is shut down for an auto-stop/start event, for example, when a driver releases the brake pedal and/or depresses the accelerator pedal.

Sail events may include the ECM 114 shutting down the engine 102 when the vehicle is moving (e.g., vehicle speed greater than a predetermined speed, such as 50 miles per hour), the driver is not actuating the accelerator pedal, and the driver has not input a key OFF command. An engine start command may be generated while the engine 102 is shut down for a sail event, for example, when a driver depresses the accelerator pedal. The driver may input a key OFF command, for example, via actuating the one or more ignition keys, buttons, and/or switches, as discussed above.

A starter motor actuator, such as a solenoid, may actuate the starter motor 202 into engagement with the engine 102. For example only, the starter motor actuator may engage a starter pinion with a flywheel coupled to the crankshaft. In various implementations, the starter pinion may be coupled to the starter motor 202 via a driveshaft and a one-way clutch. A starter actuator module 204 controls the starter motor actuator and the starter motor 202 based on signals from a starter control module, as discussed further below. In various implementations, the starter motor 202 may be maintained in engagement with the engine 102.

In response to a command to start the engine 102 (e.g., an auto-start command, an engine start command for an end of a sail event, or when a key ON command is received), the starter actuator module 204 supplies current to the starter motor 202 to start the engine 102. The starter actuator module 204 may also actuate the starter motor actuator to engage the starter motor 202 with the engine 102. The starter actuator module 204 may supply current to the starter motor 202 after engaging the starter motor 202 with the engine 102, for example, to allow for teeth meshing.

The application of current to the starter motor 202 drives rotation of the starter motor 202, and the starter motor 202 drives rotation of the crankshaft (e.g., via the flywheel). The period of the starter motor 202 driving the crankshaft to start the engine 102 may be referred to as engine cranking.

The starter motor 202 draws power from the MODACS 208 to start the engine 102. Once the engine 102 is running after the engine startup event, the starter motor 202 disengages or is disengaged from the engine 102, and current flow to the starter motor 202 may be discontinued. The engine 102 may be considered running, for example, when an engine speed exceeds a predetermined speed, such as a predetermined idle speed. For example only, the predetermined idle speed may be approximately 700 revolutions per minute (rpm) or another suitable speed. Engine cranking may be said to be completed when the engine 102 is running.

A generator 206 converts mechanical energy of the engine 102 into alternating current (AC) power. For example, the generator 206 may be coupled to the crankshaft (e.g., via gears or a belt) and convert mechanical energy of the engine 102 into AC power by applying a load to the crankshaft. The generator 206 rectifies the AC power into DC power and stores the DC power in the MODACS 208. Alternatively, a rectifier that is external to the generator 206 may be implemented to convert the AC power into DC power. The generator 206 may be, for example, an alternator. In various implementations, such as in the case of a belt alternator starter (BAS), the starter motor 202 and the generator 206 may be implemented together.

Figure 6:
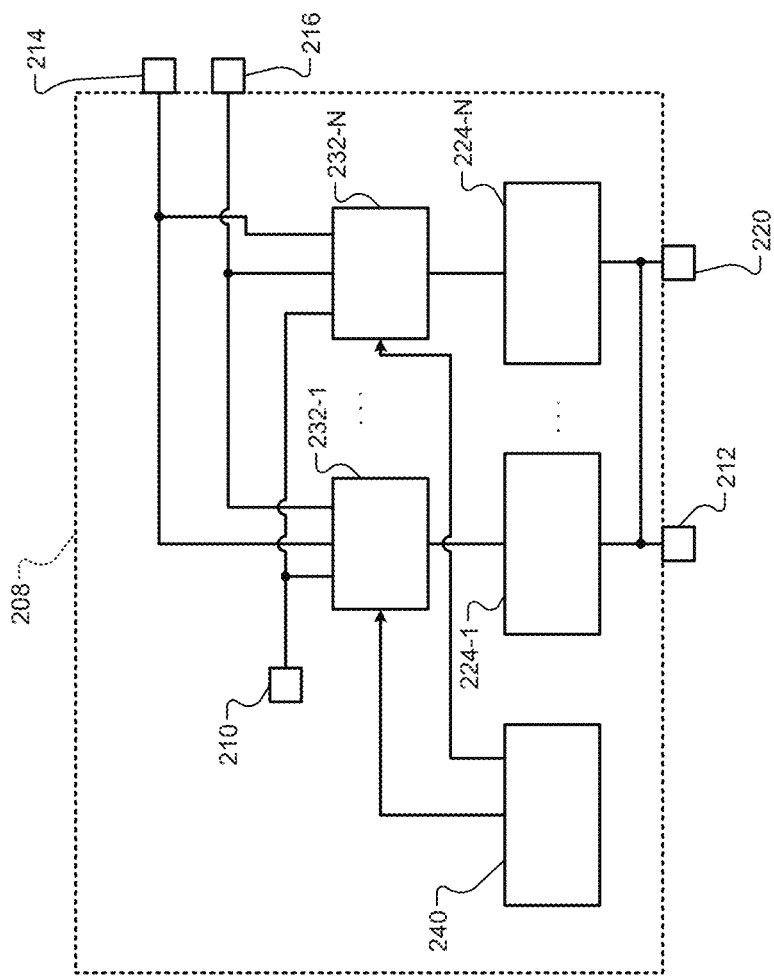
FIG. 6 is a functional block diagram of an example MODACS.

FIG. 6 is a functional block diagram of the MODACS 208. The MODACS 208 may be implemented as a single battery having multiple source terminals. Three example source terminals 210, 214, 216 are shown, although any number of source terminals may be included. The source terminals, which may be referred to as positive output terminals, provide respective direct current (DC) operating voltages. The MODACS may include only one negative terminal or may include a negative terminal for each source terminal. For example only, the MODACS 208 may have a first positive (e.g., 48 Volt (V)) terminal 210, a first negative terminal 212, a second positive (e.g., a first 12V) terminal 214, a third positive (e.g., a second 12V) terminal 216, and a second negative terminal 220. While the example of the MODACS 208 having a 48V operating voltage and two 12V operating voltages is provided, the MODACS 208 may have one or more other operating voltages, such as only two 12V operating voltages, only two 48V operating voltages, two 48V operating voltages and a 12V operating voltage, or a combination of two or more other suitable operating voltages. As another example, the operating voltages may range from 12V-144V.

The MODACS 208 includes cells and/or blocks of cells, such as a first block 224-1 to an N-th block 224-N ("blocks 224"), where N is an integer greater than or equal to 2. Each of the blocks 224 may include one or more CAB cells and/or one or more non-CAB cells. Each CAB cell includes LIB electrodes and LIC electrodes. In each of the CAB cells, the number of LIC electrodes may be less than the number of LIB electrodes. As an example, in a CAB cell, 4% of the electrodes may be LIC electrodes and 96% of the electrodes are LIB electrodes. Each block may be implemented as a CAB module or a non-CAB module. In one embodiment, each CAB module and non-CAB module has an output voltage that is an integer multiple of 12V. Each block may also be separately replaceable within the MODACS 208. For example only, each of the blocks 224 may be an individually housed 12V DC battery. The ability to individually replace the blocks 224 may enable the MODACS 208 to include a shorter warranty period and have a lower warranty cost. The blocks 224 are also individually isolatable, for example, in the event of a fault in a block. In various implementations, the MODACS 208 may have the form factor of a standard automotive grade 12V battery.

Each of the blocks 224 has its own separate capacity (e.g., in amp hours, Ah). The MODACS 208 includes switches, such as first switches 232-1 to 232-N (collectively "switches 232"). The switches 232 enable the blocks 224 to be connected in series, parallel, or combinations of series and parallel to provide desired output voltages and capacities at the output terminals.

A MODACS control module 240 controls the switches 232 to provide desired output voltages and capacities at the source terminals. The MODACS control module 240 controls the switches 232 to vary the capacity provided at the source terminals based on a present operating mode of the vehicle, as discussed further below.

Figure 7A:
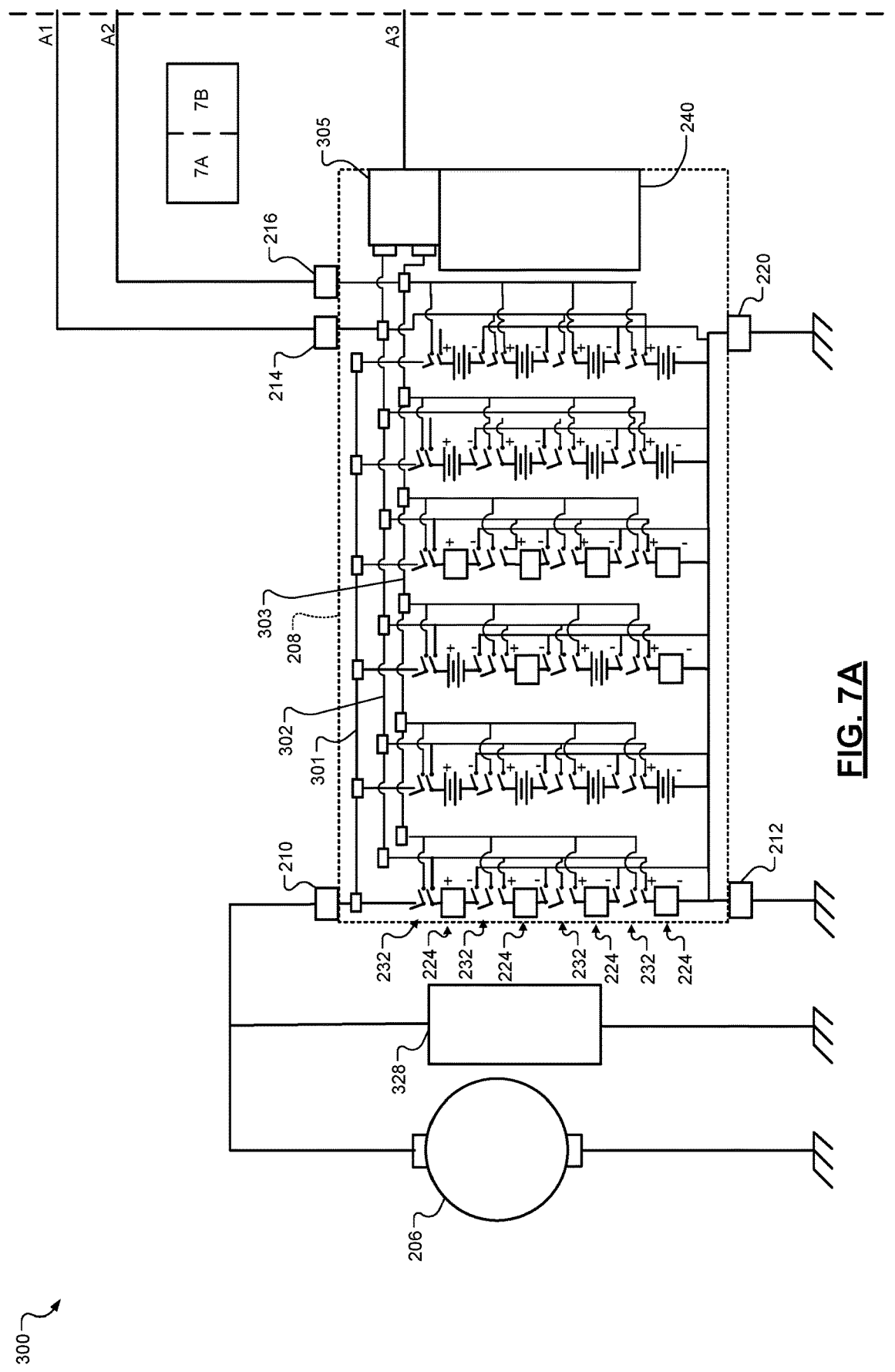
FIGS. 7A-7B are a schematic including an example implementation of a MODACS.
Figure 7B:
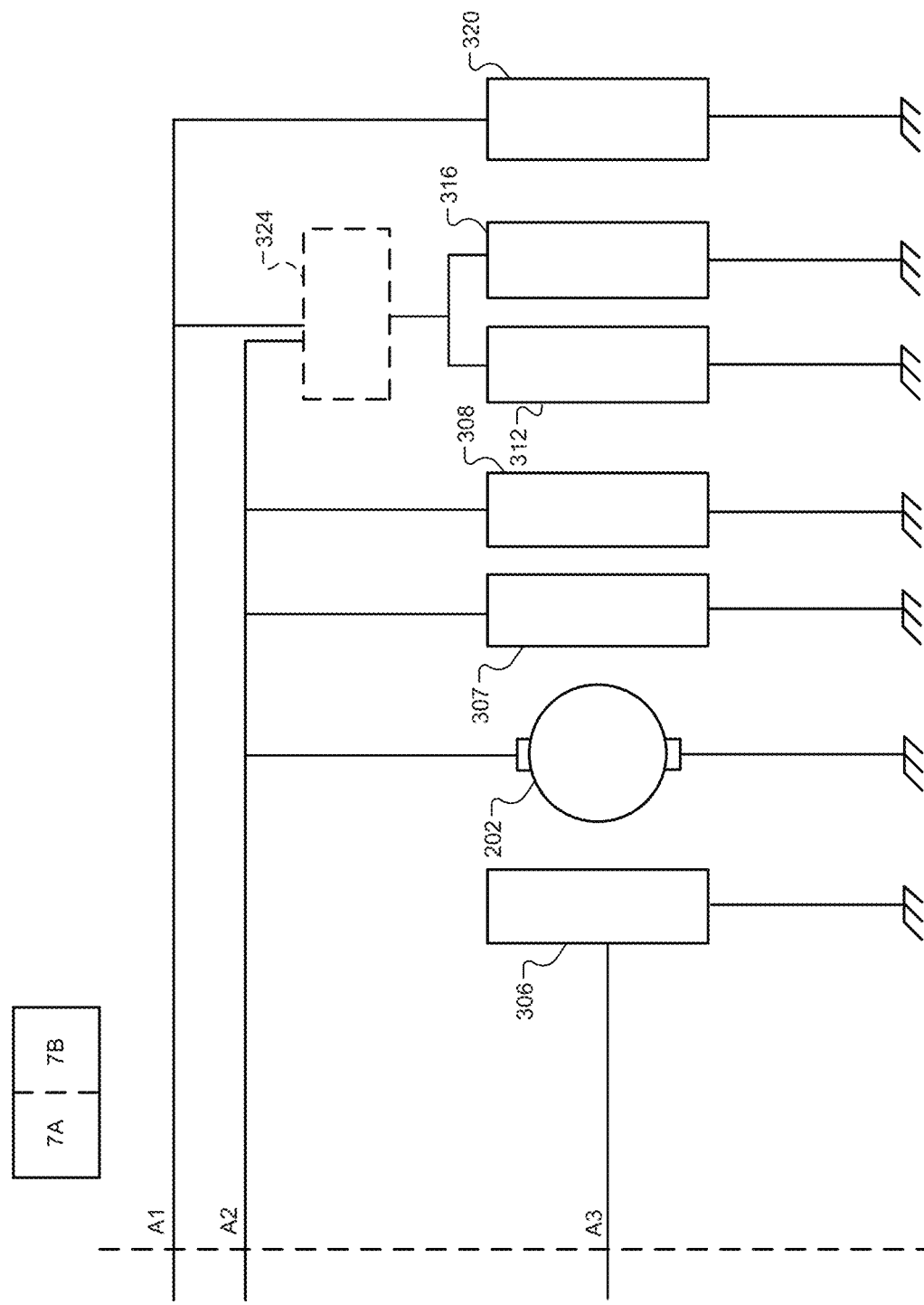

FIGS. 7A-7B show a vehicle electrical system 300 including an example implementation of the MODACS 208. The MODACS 208 includes the source terminals 210, 214, 216, respective power rails 301, 302, 303, a MODACS control module 240, and a power control circuit 305, which may be connected to the MODACS control module 240 and vehicle control module (VCM) and/or BCM 306. The VCM and/or BCM 306 may operate similar as, include and/or be implemented as the ECM 114 of FIG. 5. Power rail 303 may be a redundant power rail and/or used for different loads than the power rail 302. The MODACS control module 240, the power control circuit 305 and the VCM and/or BCM 306 may communicate with each other via a controller area network (CAN), a local interconnect network (LIN), a serial network, wirelessly and/or another suitable network and/or interface. The MODACS control module 240 may communicate with the VCM and/or BCM 306 directly or indirectly via the power control circuit 305 as shown.

In the example of FIG. 7A, sets of 4 of the blocks 224 (e.g., 12V blocks) are connectable in series (via ones of the switches 232) to the first positive terminal 210 and the first negative terminal 212 to provide a first output voltage (e.g., 48V). Individual ones of the blocks 224 may be connected (via ones of the switches 232) to the second positive terminal 214 or the third positive terminal 216 and the second negative terminal 220 to provide a second output voltage (e.g., 12V) at the second and third positive terminals 214 and 216. How many of the blocks 224 are connected to the first positive terminal 210, the second positive terminal 214, and the third positive terminal 216 dictates the portions of the overall capacity of the MODACS 208 available at each of the positive terminals. Any number of the blocks may be connected in series and any number of series sets may be connected in parallel. In the example of FIG. 7A, the blocks 224 are shown as CAB modules and non-CAB modules. The CAB modules are labeled "CAB" and the non-CAB modules are shown with battery symbols. The example includes two series including only CAB modules, one series including both CAB modules and non-CAB modules, and three series including only non-CAB modules. The number of only CAB module series, the number of series having both CAB and non-CAB modules, and the number of series having only non-CAB modules may be adjusted. Also, the number of CAB modules and the number of non-CAB modules in each series may be adjusted and may be different. Examples of the CAB modules and CAB cells that may be implemented in the CAB modules are shown in FIGS. 12-22.

As shown in FIG. 7B, a first set of vehicle electrical components operates using one of the two or more operating voltages of the MODACS 208. For example, the first set of vehicle electrical components may be connected to the second and third positive terminals 214 and 216. Some of the first set of vehicle electrical components may be connected to the second positive terminal 214, and some of the first set of vehicle electrical components may be connected to the third positive terminal 216. The first set of vehicle electrical components may include, for example but not limited to, the VCM and/or BCM 306 and other control modules of the vehicle, the starter motor 202, and/or other electrical loads, such as first 12V loads 307, second 12V loads 308, other control modules 312, third 12V loads 316, and fourth 12V loads 320. In various implementations, a switching device 324 may be connected to both of the first and second positive terminals 214. The switching device 324 may connect the other control modules 312 and the third 12V loads 316 to the second positive terminal 214 or the third positive terminal 216.

As shown in FIG. 7A, a second set of vehicle electrical components operates using another one of the two or more operating voltages of the MODACS 208. For example, the second set of vehicle electrical components may be connected to the first positive terminal 210. The second set of vehicle electrical components may include, for example but not limited to, the generator 206 and various electrical loads, such as 48V loads 328. The generator 206 may be controlled to recharge the MODACS 208.

Each of the switches 232 may be an insulated gate bipolar transistor (IGBT), a field effect transistor (FET), such as a metal oxide semiconductor FET (MOSFET), or another suitable type of switch.

Figure 8:
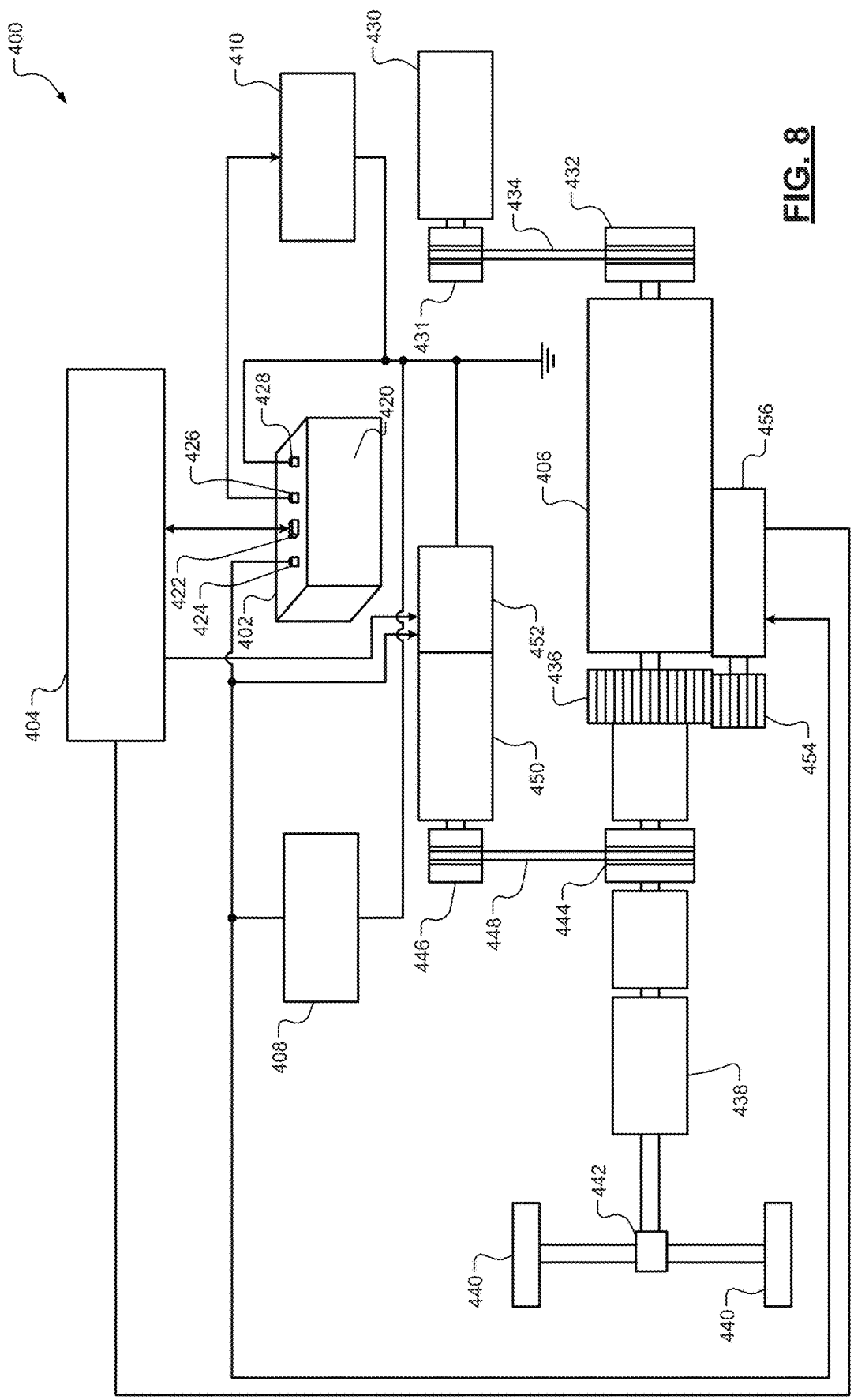
FIG. 8 is a functional block diagram of another example of a vehicle control system.

FIG. 8 shows an example of another vehicle control system 400 that is applicable to the MODACSs disclosed herein. The vehicle control system 400 includes a MODACS 402, a vehicle control module 404, an internal combustion engine (ICE) 406, high-voltage loads 408, and low-voltage loads 410. The high-voltage loads 408 may include electric motors, compressors, and/or other high-voltage loads. The low-voltage loads may include lights, seat heaters, electric fans, audio system, video system, power window motors, power door lock motors, electronic circuits, etc. The MODACS 402 has a housing 420 and includes a MODACS control module 422, a first source terminal 424, a second source terminal 426 and a negative (or reference ground) terminal 428. The MODACS 402 may have any number of source terminals.

The ICE 406 may drive a water pump 430 via pulleys 431, 432 and belt 434. The ICE 406 may drive a main gear 436, which drives a clutches C1, C2 and a Transmission 438 to drive wheels 440 via a differential 442. The first clutch C1 may be used to engage pulleys 444, 446 and belt 448, which drive a motor generator unit (MGU) 450. The second clutch C2 may be used to engage the transmission 438. An AC-to-DC converter 452 converts alternating current (AC) power from the MGU 450 to DC power, which is used to charge the cells of the MODACS 402. The main gear 436 may be turned by a second gear 454 via a starter 456 when cranking the ICE 406.

Figure 9:
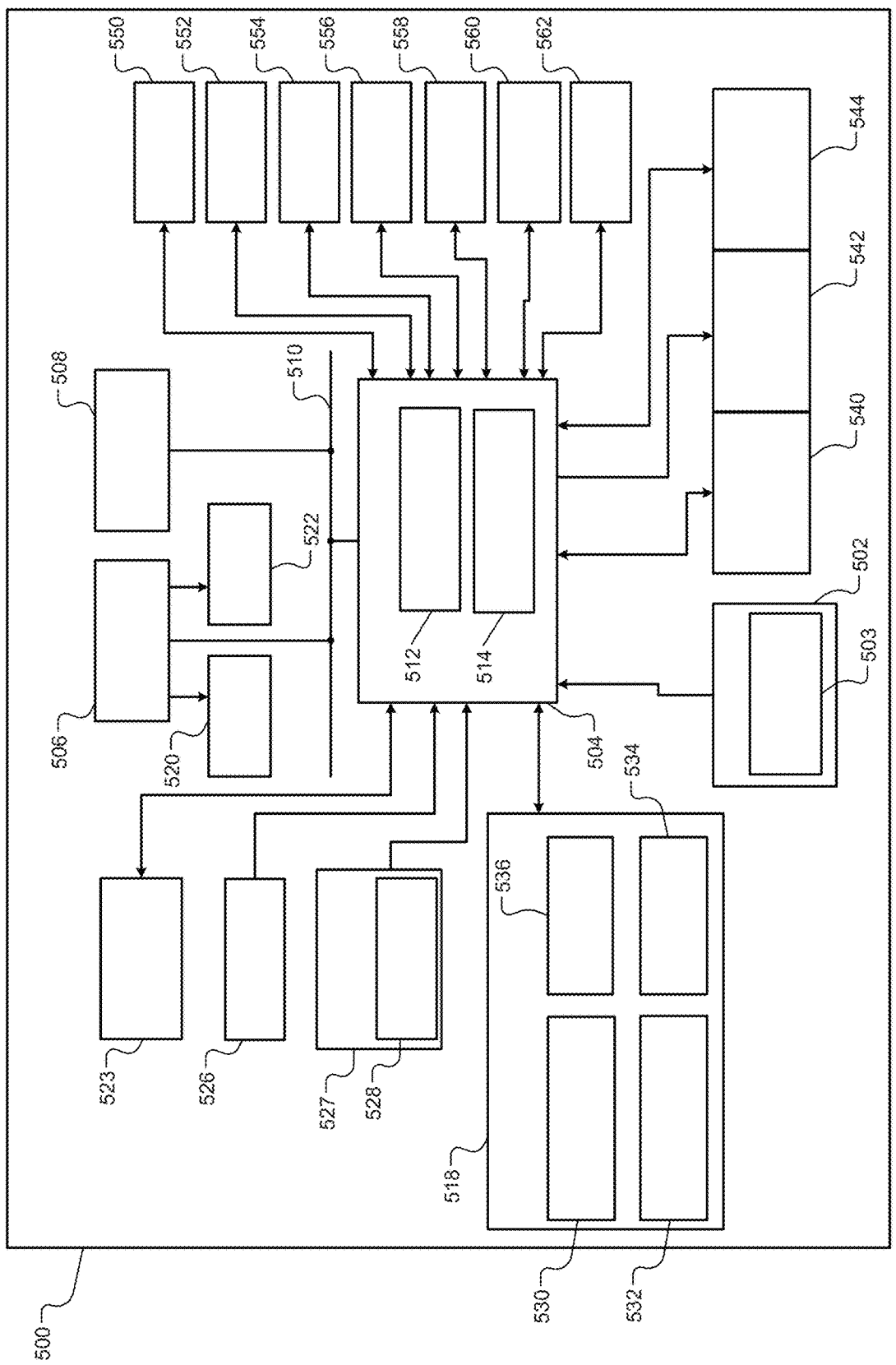
FIG. 9 is a functional block diagram of a vehicle including a MODACS.

FIG. 9 shows a vehicle 500 illustrating another example implementation of a MODACS, which may replace and/or operate similarly as the MODACS 208 and 402 of FIGS. 5-9. The vehicle 500 may include a MODACS 502 with a MODACS control module 503, a vehicle control module 504, an infotainment module 506 and other control modules 508. The modules 503, 504, 506, 508 may communicate with each other via a controller area network (CAN) bus 510 and/or other suitable interfaces. The vehicle control module 504 may control operation of vehicles systems. The vehicle control module 504 may include a mode selection module 512, a parameter adjustment module 514, as well as other modules. The mode selection module 512 may select a vehicle operating mode, such as one of the vehicle operating modes stated above. The parameter adjustment module 514 may be used to adjust parameters of the vehicle 500.

The vehicle 500 may further include: a memory 518; a display 520; an audio system 522; one or more transceivers 523 including sensors 526; and a navigation system 527 including a global positioning system (GPS) receiver 528. The sensors 526 may include sensors, cameras, objection detection sensors, temperature sensors, accelerometers, vehicle velocity sensor, and/or other sensors. The GPS receiver 528 may provide vehicle velocity and/or direction (or heading) of the vehicle and/or global clock timing information.

The memory 518 may store sensor data 530 and/or vehicle parameters 532, MODACS parameters 534, and applications 536. The applications 536 may include applications executed by the modules 503, 504, 506, 508. Although the memory 518 and the vehicle control module 504 are shown as separate devices, the memory 518 and the vehicle control module 504 may be implemented as a single device.

The vehicle control module 504 may control operation of an engine 540, a converter/generator 542, a transmission 544, a window/door system 550, a lighting system 552, a seating system 554, a mirror system 556, a brake system 558, electric motors 560 and/or a steering system 562 according to parameters set by the modules 503, 504, 506, 508. The vehicle control module 504 may set some of the parameters based on signals received from the sensors 526. The vehicle control module 504 may receive power from the MODACS 502, which may be provided to the engine 540, the converter/generator 542, the transmission 544, the window/door system 550, the lighting system 552, the seating system 554, the mirror system 556, the brake system 558, the electric motors 560 and/or the steering system 562, etc. Some of the vehicle control operations may include unlocking doors of the window/door system 550, enabling fuel and spark of the engine 540, starting the electric motors 560, powering any of the systems 550, 552, 554, 556, 558, 562, and/or performing other operations as are further described herein.

The engine 540, the converter/generator 542, the transmission 544, the window/door system 550, the lighting system 552, the seating system 554, the mirror system 556, the brake system 558, the electric motors 260 and/or the steering system 562 may include actuators controlled by the vehicle control module 504 to, for example, adjust fuel, spark, air flow, steering wheel angle, throttle position, pedal position, door locks, window position, seat angles, etc. This control may be based on the outputs of the sensors 526, the navigation system 527, the GPS 528 and the above-stated data and information stored in the memory 518.

The vehicle control module 504 may determine various parameters including a vehicle speed, an engine speed, an engine torque, a gear state, an accelerometer position, a brake pedal position, an amount of regenerative (charge) power, an amount of boost (discharge) power, an amount of autostart/stop discharge power, and/or other information, such as priority levels of source terminals of the MODACS 502, power, current and voltage demands for each source terminal, etc. The vehicle control module 504 may share this information and the vehicle operating mode with the MODACS control module 503. The MODACS control module 503 may determine other parameters, such as: an amount of charge power at each source terminal; an amount of discharge power at each source terminal; maximum and minimum voltages at source terminals; maximum and minimum voltages at power rails, cells, blocks, packs, and/or groups; SOX values cells, blocks, packs, and/or groups; temperatures of cells, blocks, packs, and/or groups; current values of cells, blocks, packs, and/or groups; power values cells, blocks, packs, and/or groups; etc. The MODACS control module 503 may determine connected configurations of the cells and corresponding switch states as described herein based on the parameters determined by the vehicle control module 504 and/or the MODACS control module 503.

Figure 10:
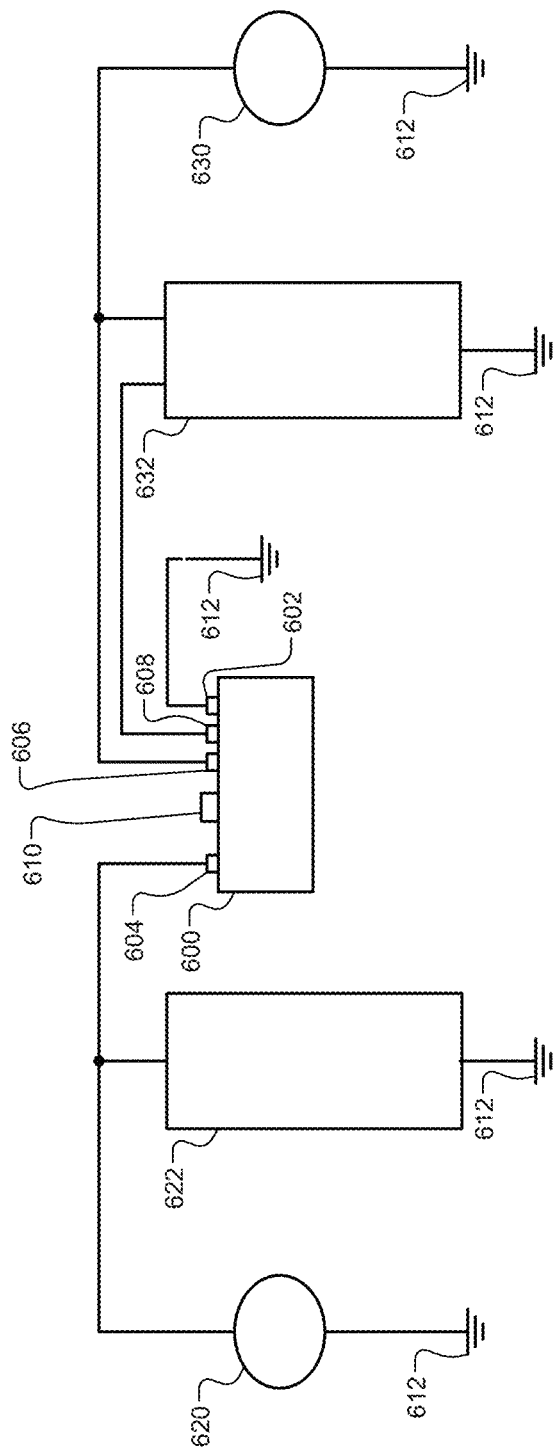
FIG. 10 is a functional block diagram of an example MODACS used with a 12V starter and a starter generator unit.

FIG. 10 shows a MODACS 600 that includes a negative (or ground reference) terminal 602, source terminals 604, 606, 608, and a MODACS control module 610. Although three source terminals are shown, the MODACS 600 may include any number of source terminals. The negative terminal 602 is connected to a negative terminal 612. The source terminals 604, 606, 608 supply and/or receive power at respective voltages. In the example shown, the source terminals 604, 606, 608 are 48V, 12V, 12V terminals. In an embodiment, the terminals 606, 608 are referred to as 12VA and 12VB terminals. The source terminal 604 may be connected to a starter generator unit (SGU) 620 and 48V loads 622. The 48V loads may include, for example, motors, compressors, and/or other high-voltage loads. The SGU 620 is shown as an example. In one embodiment, one or more 48V starters, one or more 48V generators and/or a 48V SGU is included. The source terminals 606, 608 may be connected to a 12V starter 630 and 12V loads 632.

Figure 11:
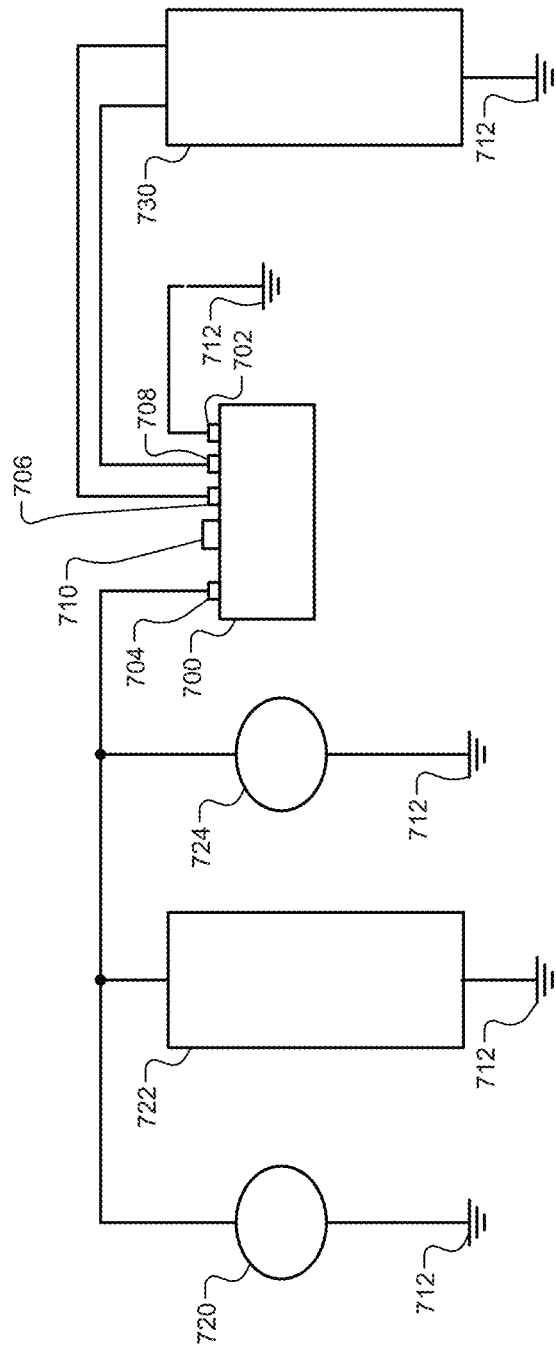
FIG. 11 is a functional block diagram of an example MODACS used with a 48V starter and a starter generator unit.

FIG. 11 shows a MODACS 700 that includes a negative (or ground reference) terminal 702, source terminals 704, 706, 708, and a MODACS control module 710. Although three source terminals are shown, the MODACS 700 may include any number of source terminals. The negative terminal 702 may be connected to a ground reference terminal 712. The source terminals 704, 706, 708 supply and/or receive power at respective voltages. In the example shown, the source terminals 704, 706, 708 are 48V, 12V, 12V terminals. The terminals 706, 708 may be referred to as 12VA and 12VB terminals. The source terminal 704 may be connected to a starter generator unit (SGU) 720, 48V loads 722, and a 48V starter 724. The source terminals 706, 708 may be connected to 12V loads 730.

Based on the vehicle operating mode and the MODACS operating mode, the above SGUs, 48V starter and/or 12V starters may be used for hot starts when a temperature of the corresponding engine is above a predetermined temperature. As an example, when operating in an electrical only mode (engine is OFF) and a SGU is providing power to drive a vehicle, a 12V starter or a 48V starter may be used to start the engine. A 48V starter or a 12V starter may be used for a cold start when a temperature of the corresponding engine is below a predetermined temperature. FIGS. 10-11 are implemented without use of a DC-to-DC converter.

Figure 12:
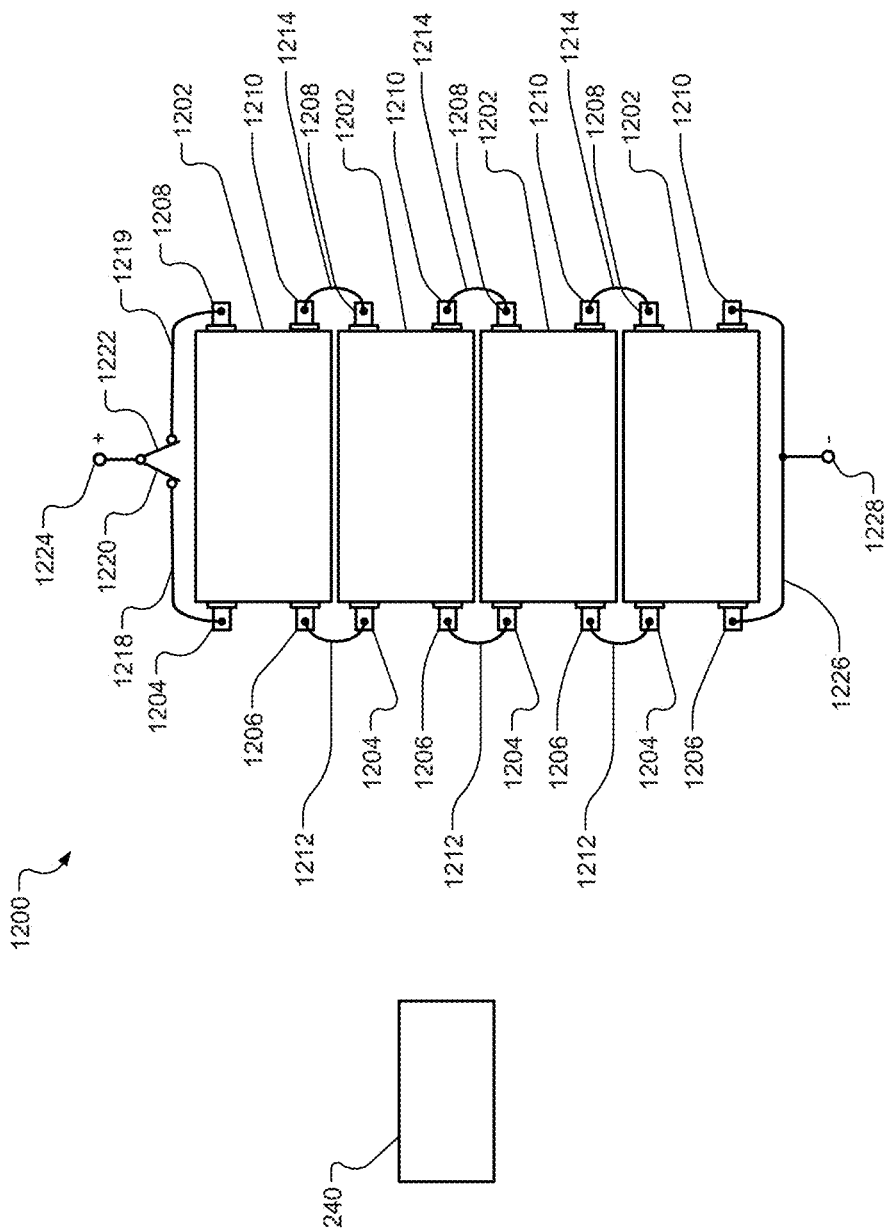
FIG. 12 is a functional block diagram of an example of a CAB module including a LIB switch and a lithium ion capacitor (LIC) switch.

FIG. 12 shows a CAB module 1200 that includes CAB cells 1202, which as disclosed herein may have any number of battery electrodes and capacitor electrodes. The battery electrodes referred to herein have cathode and anode layers of battery materials. As an example, the cathode layers may be formed of LMO, LFP, NMC, LNMO and/or other suitable battery cathode materials. The anode layers may be formed of silicon oxide (SiOx), LTO, graphite and/or other suitable battery anode materials. The capacitor electrodes referred to herein have cathode and anode layers of capacitor materials. The capacitor cathode materials may include activated carbon and/or other suitable capacitor cathode materials. The capacitor anode materials may include graphite, lithiated graphite, lithiated SiOx, LTO and/or other suitable capacitor anode materials. The CAB cells may include a predetermined number of battery cathode electrodes connected in parallel to LIB+ terminals 1204, a predetermined number of battery anode electrodes connected in parallel to LIB-terminals 1206, a predetermined number of capacitor cathode electrodes connected in parallel to LIC+ terminals 1208, and a predetermined number of capacitor anode electrodes connected in parallel to LIC-terminals 1210.

The LIB battery electrodes of the CAB cells 1202 are connected in series via conductive elements (e.g., wires) 1212. The LIC capacitor electrodes of the CAB cells 1202 are connected in series via conductive elements (e.g., wires) 1214. The LIB+ and LIC+ terminals of the first CAB cell are connected via conductive elements 1218, 1219 to respective switches 1220, 1222. The switches 1220, 1222 are connected to a positive terminal 1224. The LIB- and LIC-terminals of the last CAB cell are connected via a conductive element 1226 to a negative terminal 1228. Each of the CAB cells 1202 includes 4 terminals (or tabs).

The switches 1220, 1222 (referred to as LIB and LIC switches) are controlled via the MODACS control module 240. The MODACS control module 240 may close (or transition the switches to an ON state) and open (or transition the switches to an OFF state) based on an operating mode. Table 1 provides example operating modes and corresponding states of the LIB and LIC switches. For the example of Table 1 all of the LIB switches may either be ON or OFF and all of the LIC switches may either be ON or OFF and the CAB cells 1202 include: LIB cathodes formed of NMC; the LIB and LIC anodes formed of graphite; and the LIC cathodes formed of activated carbon (AC).

TABLE 1

| Operating Mode | LIB Switch | LIC Switch |
|---|---|---|
| Charge | ON | ON (CAB cell voltage ≤3.9 V) |
|  | ON | OFF (CAB cell voltage >3.9 V) |
| Regenerate | OFF | ON (CAB cell voltage ≤3.9 V) |
|  | ON | OFF (CAB cell voltage >3.9 V) |
| Cold Crank | ON | ON |
| Boost | OFF | ON |
| Auto Start | ON | ON |
| Off Test/Mode | ON | OFF |
| Auxiliary Mode (Dual Batteries) | ON | ON |
| 12 V Stab (for EV) | ON | OFF |

The MODACS module 240 may monitor the voltages across the LIB terminals and across the LIC terminals of each of the CAB cells and based on the voltages turn ON or OFF the switches 1220, 1222. A CAB cell voltage refers to the voltage provided by that CAB cell and may include the voltage across LIB terminals, LIC terminals and/or a parallel connected combination of the LIB terminals and LIC terminals. In the example of FIG. 12, when the CAB cell voltages and/or the voltage across the LIC terminals of each of one or more of the CAB cells are greater than or equal to 3.9V, the MODACS control module 240 opens the switch 1222 to disconnect the LIC electrodes. This allows the battery electrodes to charge to a voltage greater than 3.9V while preventing LIC electrodes from being charged over 3.9V. As an example, the MODACS control module 240 may maintain the CAB cell voltage and/or voltage across the LIB terminals to less than or equal to 5V.

The overall voltage of the CAB module 1200 across the terminals 1224 and 1228 may be adjusted by the number of CAB cells included and connected in series. The overall voltage of the CAB module 1200 may be, for example, 12V, 24V, 36V, 48V, etc. In one embodiment, the CAB cells 1202 and the switches 1220, 1222 are disposed in a single housing. In another embodiment, the switches 1220, 1222 are disposed in the housing of the first CAB cell.

One or more of the CAB cells 1202 and/or other CAB cells disclosed herein may be replaced with one or more non-CAB cells. The non-CAB cells do not include LIC terminals and/or electrodes. As an example, if one of the CAB cells 1202 is replaced with a non-CAB cell, then the connections would be similar except the LIC terminals of three CAB cells would be connected in series and the LIB terminals of the four cells would be connected in series.

Figure 13:
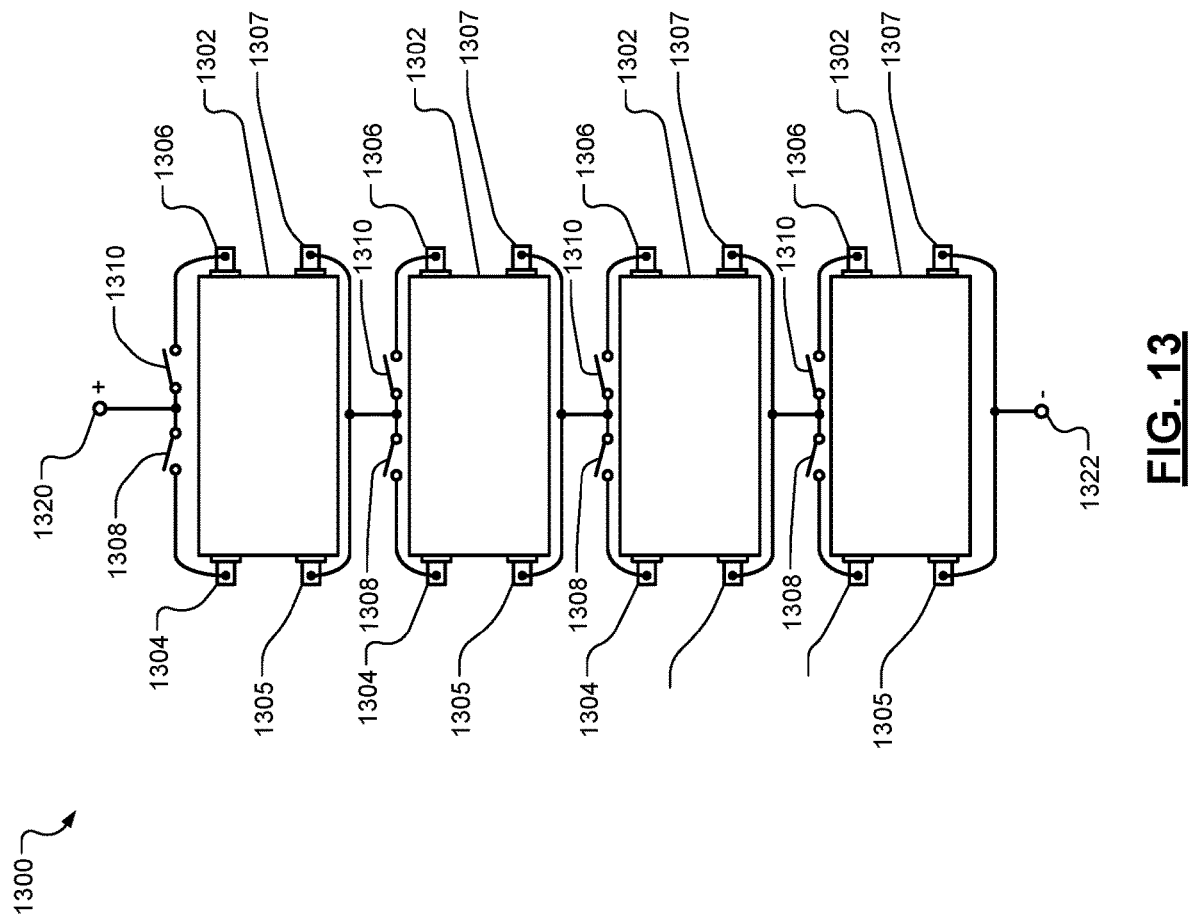
FIG. 13 is a functional block diagram of an example of a CAB module including LIB switches and LIC switches.

FIG. 13 shows a CAB module 1300 that includes CAB cells 1302. The CAB cells 1302 include: LIB cathodes formed of NMC, LIB and LIC anodes formed of graphite, and LIC cathodes formed of AC. Each of the CAB cells 1302 includes LIB terminals 1304, 1305 and LIC terminals 1306, 1307 and corresponding LIB switches 1308 and LIC switches 1310. The switches 1308, 1310 allow and corresponding conductive elements shown allow LIB electrodes and LIC electrodes of each of the CAB cells to be selectively connected to CAB module terminals 1320, 1322. The MODACS control module 240 may control the switches based on operating mode. Table 2 shows example operating modes and corresponding states of the switches 1308, 1310.

TABLE 2

| Operating Mode | LIB Switches | LIC Switches |
|---|---|---|
| Charge | ON | ON (CAB cell voltage ≤3.9 V) |
|  | ON | OFF (CAB cell voltage >3.9 V) |
| Regenerate | OFF | ON (CAB cell voltage ≤3.9 V) |
|  | ON | OFF (CAB cell voltage >3.9 V) |
| Cold Crank | ON | Selected One or More ON |
| Boost | OFF | Selected One or More ON |
| Auto Start | ON | Selected One or More ON |
| Off Test/Mode | ON | OFF |
| Auxiliary Mode (Dual Batteries) | ON | ON |
| 12 V Stab (for EV) | ON | OFF |

The MODACS module 240 may selectively turn ON (or connect) the LIB terminals for one or more of the CAB cells 1302 and selectively turn ON the LIC terminals for one or more of the CAB cells 1302. This may be based on voltages across the LIB terminals and the voltages across the LIC terminals of each of the CAB cells 1302 and/or the operating mode. Table 2 provides an example, where for the cold crank, boost and auto start modes the LIC terminals of one or more of the CAB cells is turned ON, whereas for the other modes the LIC terminals of all of the CAB cells are either turned OFF or turned ON. In one embodiment, the CAB cells 1302 and the switches 1308, 1310 are disposed in a single housing. In another embodiment, the switches 1308, 1310 are disposed in corresponding housings of the CAB cells 1302.

Figure 14:
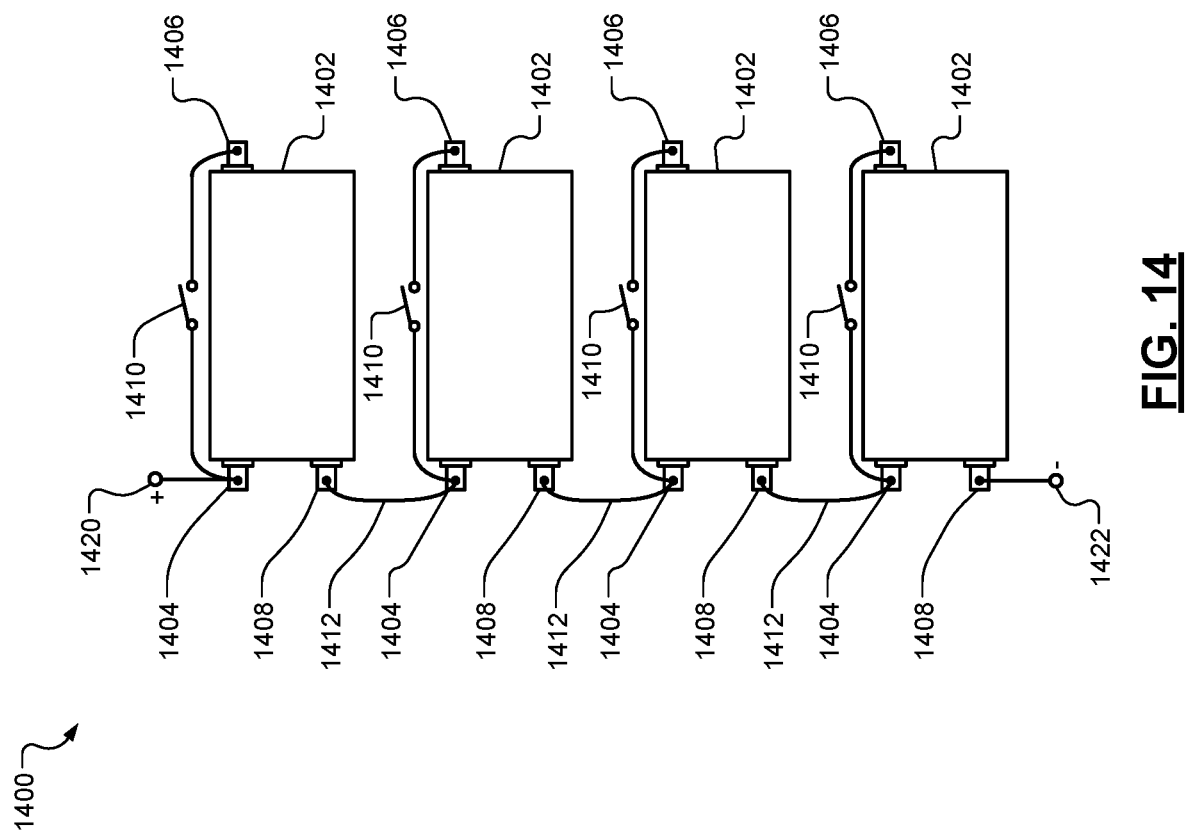
FIG. 14 is a functional block diagram of an example of a CAB module including LIC switches.

FIG. 14 shows a CAB module 1400 that includes CAB cells 1402. The CAB cells 1402 include: LIB cathodes formed of NMC; LIB and LIC anodes formed of graphite; and LIC cathodes formed of AC. Each of the CAB cells 1402 includes a LIB+ terminal 1404, a LIC+ terminal 1406 and a CAB− terminal 1408 (also referred to as a LIB and LIC shared anode terminal). The CAB module 1400 include LIC switches 1410 that connect the LIC+ terminals to the LIB+ terminals. As a result, the LIC+ terminals may be selectively connected by the MODACS module 240. The CAB cells 1402 are connected in series by conductive elements 1412, which connect the CAB− terminals of CAB cell to a LIB+ terminal of a next CAB cell. The first LIB+ terminal the last CAB− terminal are connected respectively to positive and negative terminals 1420, 1422 of the CAB module 1400. The MODACS control module 240 may control the switches based on operating mode. Table 3 shows example operating modes and corresponding states of the switches 1410.

TABLE 3

| Operating Mode | LIC Switches |
| --- | --- |
| Charge | ON (CAB cell voltage ≤3.9 V) |
|  | OFF (CAB cell voltage >3.9 V) |
| Regenerate | ON (CAB cell voltage ≤3.9 V) |
|  | OFF (CAB cell voltage >3.9 V) |
| Cold Crank | Selected One or More ON |
| Boost | Selected One or More ON |
| Auto Start | ON |
| Off Test/Mode | OFF |
| Auxiliary Mode (Dual Batteries) | ON |
| 12 V Stab (for EV) | OFF |

The MODACS module 240 may selectively turn ON the LIC terminals for one or more of the CAB cells 1402. This may be based on voltages across the LIB+ and CAB− terminals and/or across the LIC+ and CAB− terminals of each of the CAB cells 1402 and/or the operating mode. Table 3 provides an example, where for the cold crank and boost modes the LIC terminals of one or more of the CAB cells is turned ON, whereas for the other modes the LIC terminals of all of the CAB cells are either turned OFF or turned ON. In one embodiment, the CAB cells 1402 and the switches 1410 are disposed in a single housing. In another embodiment, the switches 1410 are disposed in respective housings of the CAB cells 1402.

Figure 15:
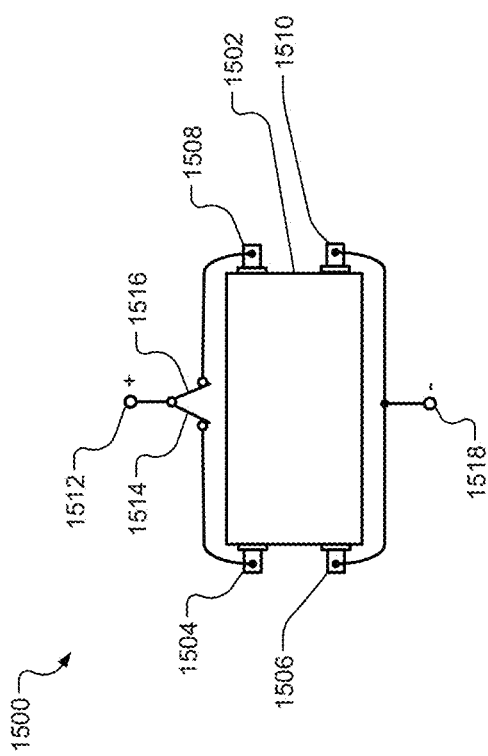
FIG. 15 is a functional block diagram of an example of a CAB module including a CAB cell having a LIB switch and a LIC switch and implemented as a solid-state battery CAB cell.

FIG. 15 shows a CAB module 1500 that includes a single CAB cell 1502 having LIB terminals 1504, 1506 and LIC terminals 1508, 1510. The LIB+ terminal 1504 and the LIC+ terminal 1508 are connected to a positive terminal 1512 via respective switches 1514, 1516. The LIB− terminal 1506 and the LIC− terminal 1510 are connected to a negative terminal 1518. The CAB cell 1502 is implemented as a solid-state battery (SSB) cell having a solid-state electrolyte (e.g., ceramic based, lithium lanthanum zirconium oxide $Li_7La_3Zr_2O_{12}$ (LLZO)). The CAB module 1500 is similar to the CAB module 1200, but includes a single CAB cell having the solid-state electrolyte. The bipolar LIB and LIC electrodes of the solid-state battery cell may be such that for one current collector foil, one surface is coated by cathode material, such as NMC, and another surface is coated by anode material, such as graphite. Electrodes and solid-state electrolyte layers between electrodes of the CAB cell 1502 may be filled with the solid-state electrolyte materials. This is different than CAB cells including a liquid or semi-liquid electrolyte. The CAB cells of FIGS. 12-14 may include, for example, a liquid electrolyte or may be of a hybrid type and include a semi-liquid electrolyte. The electrolyte of each of the CAB cells fills micro-pores of electrodes and separators between electrodes in each of the CAB cells.

The MODACS control module 240 (not shown in FIG. 15) may control states of the switches 1514, 1516 based on the LIB, LIC voltages and overall voltage of the CAB cell 1502 and an operating mode. Example states of the switches 1514, 1516 for different operating modes are shown in Table 4.

TABLE 4

| Operating Mode | LIB Switch | LIC Switch |
| --- | --- | --- |
| Charge | ON | ON |
| Regenerate | OFF | ON |
| Cold Crank | ON/OFF | ON |
| Boost | OFF/ON | ON |
| Auto Start | ON | ON |
| Off Test/Mode | ON | OFF |
| Auxiliary Mode (Dual Batteries) | ON | ON |
| 12 V Stab (for EV) | ON | OFF |

In one embodiment, the CAB cell 1502 and the switches 1514, 1516 are disposed in a single housing. In another embodiment, the switches 1514, 1516 are disposed in a housing of the CAB cell 1502. The CAB cell 1502, as with other CAB cells disclosed herein, has a bipolar architecture. The voltage of the CAB module 1500 may be adjusted by adjusting sizes, materials, spacing, etc. of the battery electrodes and capacitor electrodes included in the CAB cell 1502.

Figure 16:
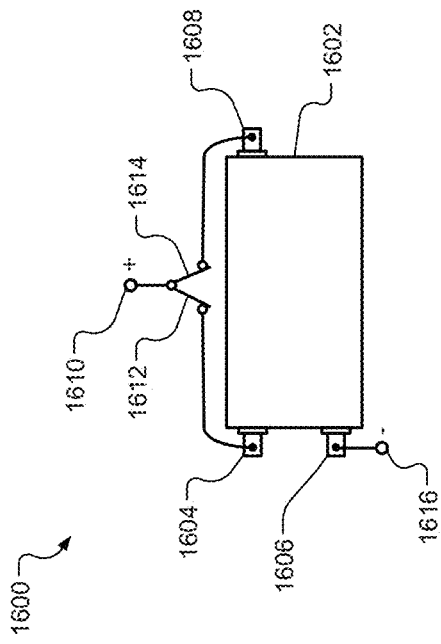
FIG. 16 is a functional block diagram of an example of a CAB module including a single CAB cell having a LIB switch, a LIC switch and a single CAB anode and implemented as a solid-state battery CAB cell.

FIG. 16 shows a CAB module 1600 including a single CAB cell 1602 having a LIB+ terminal 1604, a LIC+ terminal 1606, and a CAB− terminal 1608. The terminals 1604, 1608 are connected to a positive terminal 1610 via respective switches 1612, 1614. The CAB− terminal 1608 is connected to a negative terminal 1616. The CAB cell 1602 may be implemented as a SSB cell. The CAB module 1600 is similar to the CAB module 1300, but includes a single CAB cell and a solid electrolyte.

The MODACS control module 240 (not shown in FIG. 16) may control states of the switches 1612, 1614 based on the LIB, LIC voltages and overall voltage of the CAB cell 1602 and an operating mode. Example states of the switches 1612, 1614 for different operating modes are shown in Table 4.

FIG. 17 shows a CAB module 1700 that includes dual CAB cells 1702 having LIB terminals 1704, 1706 and LIC terminals 1708, 1710. The LIB+ terminal 1704 and the LIC+ terminal 1708 of the first CAB cell are connected to a positive terminal 1712 via respective switches 1714, 1716. The LIB− terminal 1706 and the LIC− terminal 1710 of the second CAB cell are connected to a negative terminal 1718. The CAB cells 1702 are connected in series via conductive elements 1720.

The CAB cells 1702 are implemented as a solid-state battery (SSB) cells having a solid electrolyte (e.g., ceramic=sulfide based, lithium germanium phosphorus sulfide $Li_{10}GeP_2S_{12}$, (LGPS)). The CAB module 1700 is similar to the CAB module 1500 of FIG. 15, but includes two CAB cells. As an example, the CAB cells 1702 may each provide 6V for a combined 12V at the terminals 1712, 1718. The CAB cell 1502 of the CAB module 1500 of FIG. 15 may provide 12V. The overall voltage of the CAB module 1700 may be adjusted by adjusting the number of CAB cells connected in series and/or by adjusting sizes, materials, spacing, etc. of the battery electrodes and capacitor electrodes included in the CAB cell 1702.

The MODACS control module 240 (not shown in FIG. 17) may control states of the switches 1714, 1716 based on the LIB, LIC and overall voltage of the CAB cells 1702 and an operating mode. Example states of the switches 1714, 1716 for different operating modes are shown in Table 4.

In one embodiment, the CAB cell 1702 and the switches 1714, 1716 are disposed in a single housing. In another embodiment, the switches 1714, 1716 are disposed in a housing of the CAB cell 1702. The CAB cell 1702 has a bipolar architecture. The voltage of the CAB module 1700 may be adjusted based on, for example, the number of CAB cells included in the CAB module 1700.

Figure 18:
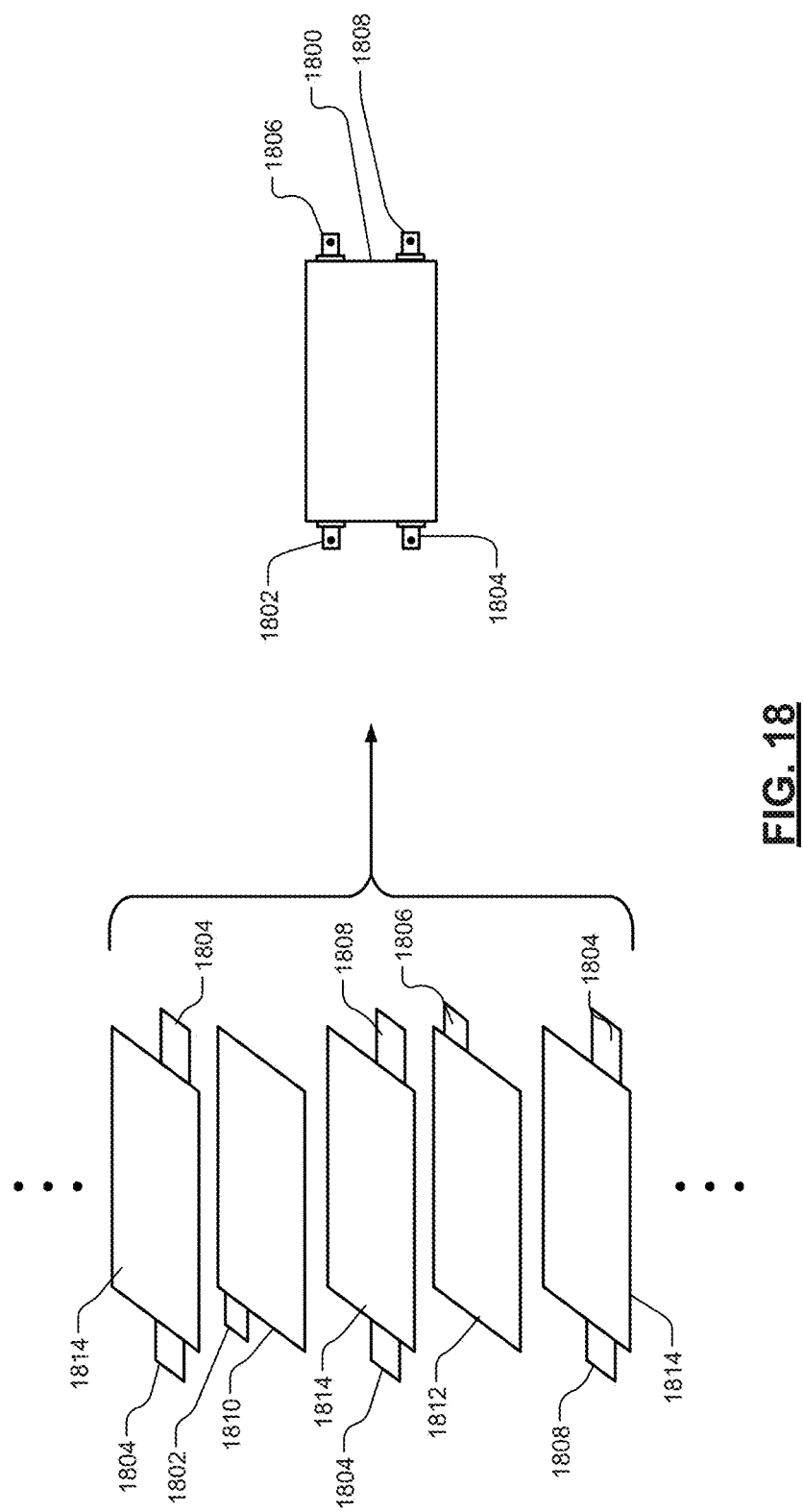
FIG. 18 is a functional block diagram of a CAB cell illustrating corresponding types of electrodes.

FIG. 18 shows a CAB cell 1800 that has LIB terminals 1802, 1804 and LIC terminals 1806, 1808. In FIG. 18 a sample cell architecture for the CAB cell 1800 is shown having three different types of electrodes; a LIB cathode electrode 1810 (one of which is shown), a LIC cathode electrode 1812 (one of which is shown) and an anode electrode 1814 (three of which are shown). The CAB cells disclosed herein that have four terminals may have the makeup of the CAB cell 1800. The CAB cell 1800 may have various numbers of each of the three types of electrodes. In one embodiment, a predetermined percentage (e.g., less than or equal to 4%) of the total number of LIB and LIC electrodes are LIC electrodes. Although a particular number of each type of the electrodes 1810, 1812, 1814 are shown in FIG. 18, any number of each of the electrodes may be included.

In one embodiment, the LIB cathode electrode 1810 is formed of NMC, the anode electrodes 1814 are formed of graphite, and the voltage when fully discharged (e.g., 60% charged) of the LIB side of the CAB cell 1800 may be at 2.7V and when fully charged (e.g., 80% charged) may be at 4.2V. The voltage on the LIC side may be 2.7V-3.9V and the LIC cathode and anode electrodes may be formed of actuated carbon. The LIC anode electrodes may be formed of graphite. As another example, if the LIB cathode electrode 1810 is formed of LNMO, then the fully discharged to fully charged voltage range may be 3-5V. If the LIB cathode electrode 1810 is formed of LFP, then the fully discharged to fully charged voltage range may be 2-3.65V.

Figure 20:
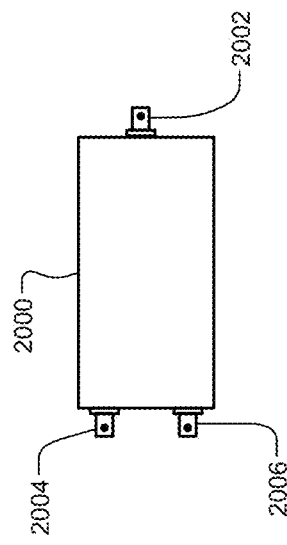
FIG. 20 is a functional block diagram of a CAB cell including a single CAB anode terminal on a different side than LIB and lithium ion capacitor (LIC) cathodes terminals.
Figure 19:
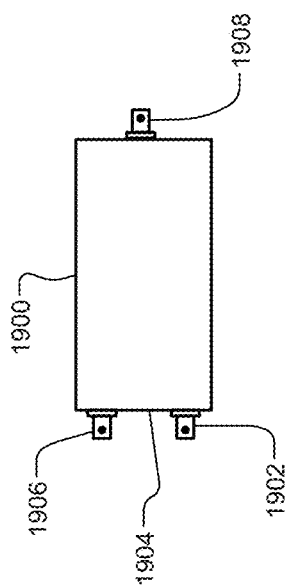
FIG. 19 is a functional block diagram of a CAB cell including a single CAB anode terminal on a same side as a LIB cathode terminal.

The following FIGS. 19-22 show different example cell terminal architectures. FIG. 19 shows a CAB cell 1900 including a single CAB anode 1902 on a same side 1904 of the CAB cell 1900 as a LIB cathode 1906. The CAB cell 1900 includes a LIC cathode 1908 on an opposite side of the CAB cell 1900. FIG. 20 shows a CAB cell 2000 including a single CAB anode 2002 on a different side of the CAB cell than LIB and LIC cathodes 2004, 2006. As an example, the materials of the LIC cathode electrodes of the CAB cells 1900 and 2000 of FIGS. 19-20 may be formed of activated carbon and the LIB anode electrodes may be formed of NMC. The CAB anode electrodes may be formed of graphite.

Figure 22:
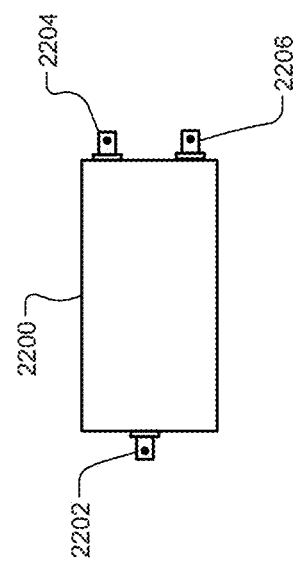
FIG. 22 is a functional block diagram of a CAB cell including a single CAB cathode terminal on a different side than LIB and LIC anodes terminals.
Figure 21:
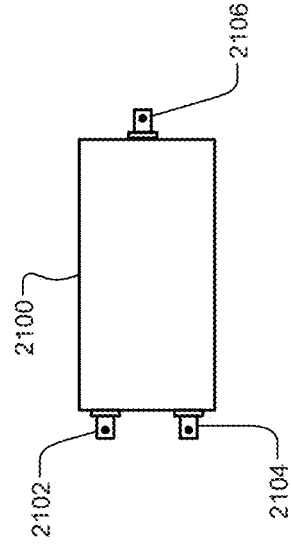
FIG. 21 is a functional block diagram of a CAB cell including a single CAB cathode terminal on a same side as a LIB anode terminal.

FIG. 21 shows a CAB cell 2100 including a single CAB cathode 2102 on a same side as a LIB anode 2104. An LIC anode 2106 is on an opposite side as the terminals 2102, 2104. FIG. 22 shows a CAB cell 2200 including a single CAB cathode 2202 on a different side than LIB and LIC anodes 2204, 2206.

As an example, the materials of the CAB cathode electrodes of the CAB cells 2100 and 2200 of FIGS. 21-22 may be formed of NMC. The LIC anode electrodes may be formed of a metal oxide, such as ruthenium oxide ($RuO_2$) and graphene. The LIB anode electrodes may be formed of graphite.

The CAB cell formats of the CAB cells disclosed herein may be prismatic and/or pouch style. The CAB cell types that may be included in the CAB modules of, for example, FIG. 7A and/or other CAB modules disclosed herein may be liquid electrolyte based, SSB types with a solid electrolyte, and/or may be hybrid types including a semi-liquid electrolyte. A semi-liquid electrolyte may include, for example, (i) a liquid and a polymer, (ii) a liquid and ceramic particles, and/or (iii) other semi-liquid electrolytes. The overall voltages of the: series of CAB modules; series of non-CAB modules; series of CAB modules and non-CAB modules; and CAB modules, disclosed herein, may each be approximately 12-150V.

FIG. 23 shows an example battery monitoring (or management) system (BMS) module 2300 for a battery pack 2302 having any number of blocks, modules, and cells. In the example shown, the BMS module 2300 monitors voltages, temperatures and current levels of the corresponding one or more cells of the block or pack 2302 and determines certain parameters. The parameters may include instantaneous charge and discharge power and current limits, short term charge and discharge power and current limits, and continuous charge and discharge power and current limits. The parameters may also include minimum and maximum voltages, minimum and maximum operating temperatures, and SOX limits and/or values. The parameters output by the BMS module 2300 may be determined based on the voltages, temperatures and/or current levels monitored. The charge and discharge power and current capability of a 12V block or pack is affected by the minimum and maximum voltages, minimum and maximum operating temperatures, and SOX limits and/or values of the corresponding cells. The BMS module 2300 may monitor individual cell voltages, temperatures and current levels and determine based on this information the stated parameters. The parameters output by the BMS module 2300 are shown as arrow out of the BMS module 2300. The parameters received by the BMS module 2300 are shown as arrow directed to the BMS module 2300.

As an example, the BMS module 2300 may include and/or be connected to sensors, such as a current sensor 2304 and a temperature sensor 2306, which may be used to detect current levels through the cells of block or pack 2302 and temperatures of the block or pack 2302. As an example, a voltage across the block or pack may be detected as shown. In an embodiment, one or more voltage sensors may be included to detect voltages of the block or pack 2302. The current sensor 2304 may be connected, for example, between the block or pack 2302 and a source terminal 2308, which may be connected to a load 2310. The temperatures, voltages, and current levels are reported to the BMS module 2300 as some of the parameters received by the BMS module 2300.

Figure 24:
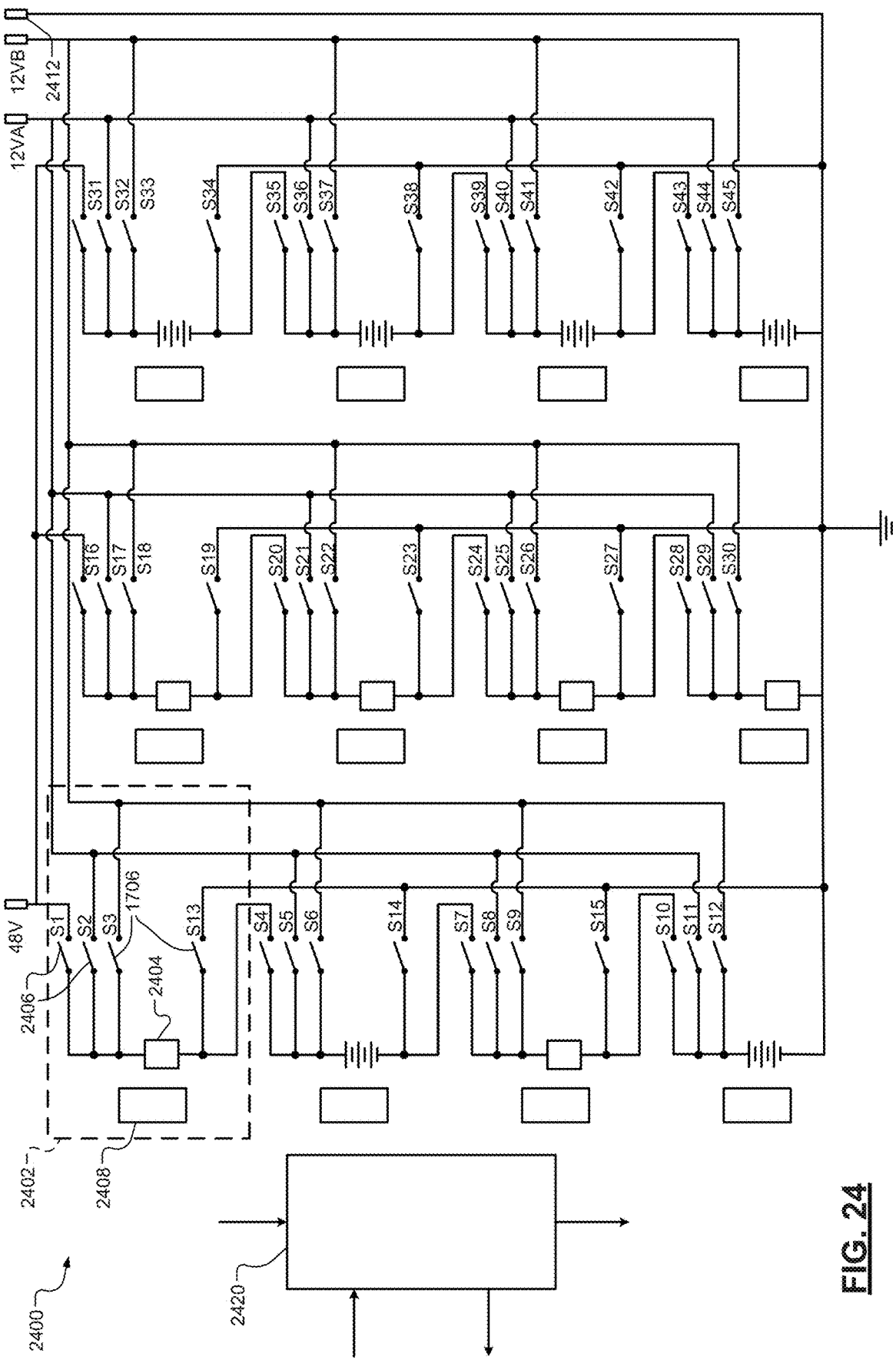
FIG. 24 is a schematic of an example MODACS circuit.

FIG. 24 shows a MODACS circuit 2400 that includes one or more source terminals. The MODACS circuit 2400 may include multi-functional solid-state switches, switch drive circuits, current and voltage sense circuits arranged in a minimum switch count topology to enable on-demand capacity allocation for source terminals having similar or dissimilar preset (or target) voltages. The MODACS circuit 2400 is flexible, modular, and has minimum size, complexity, weight, and component count. For at least these reasons, the MODACS circuit 2400 minimizes manufacturing difficulty.

As shown, the MODACS circuit 2400 includes blocks, where each block includes one or more cells, 4 or more switches, a BMS module and source terminals with corresponding power rails. An example block 2402 is outlined and includes one or more cells 2404, 4 switches 2406 and a BMS module 2408. The cells may be CAB cells or non-CAB cells. The CAB cells are shown as CAB blocks and the non-CAB cells are shown with battery symbols. Three of the switches 2406 connect the cell(s) 2404 respectively to source terminals (e.g., a 48V, 12VA, and a 12VB source terminals are shown). The fourth one of the 4 switches 2406 connects the cells(s) 2404 to a ground reference (or negative terminal) 2412.

As shown the blocks may be arranged in an array having rows and columns. Each of the blocks may be configured the same except one of the rows closest to the ground reference. In this row, each of the blocks includes three switches instead of four switches. As a result, the corresponding cells are connected to the ground reference without use of switches, as shown.

As can be seen, the cell(s) of each of the blocks may be connected to each of the source terminals. Any cell may be connected to any one or more of the source terminals. The first switches in the blocks in one of the rows (or first row) may be connected to the first source terminal (48V source terminal). The first switches in the blocks in one or more intermediate rows (e.g., the second and third rows) may be connected to cell(s) in a previous row. This allows the cell(s) in the blocks in each column to be connected in series. Under certain conditions, the blocks in columns are connected in series to form two or more series of blocks and the multiple series of blocks are connected in parallel to maximize power to the first source terminal.

The MODACS circuit 2400 further includes a MODACS control module 2420 that controls states of the blocks. The MODACS control module 2420 receives BMS signals from the BMS modules and a system capacity request signal from a vehicle control module. Based on priorities of the voltage source terminals, parameters, and power and current demands indicated by the system capacity request signal, the MODACS control module 2420 determines a connected configuration and sets states of the switches of the blocks. The parameters may include voltages, power levels, current levels, and temperatures indicated in the BMS signals. The MODACS control module 2420 generates an actual capacity allocation signal indicating capacity allocation for the source terminals. The actual capacity allocation may not match the requested capacity allocation depending on: the state of the MODACS including whether there is any faults or shorts; and the SOH of the cells. The actual capacity allocation signal may be transmitted from the MODACS control module 2420 to the vehicle control module.

The MODACS circuit 2400 includes a 12V switching matrix, architecture, and switch controls to enable elimination of 12V stabilization using a DC-to-DC converter, such as a 48V to 12V DC-to-DC buck or boost converter, and/or elimination of 12V and/or 48V redundant back-up power. The MODACS circuit 2400 has a minimal circuit, block, switch configuration for one high power, high voltage (e.g., V1 greater than or equal to 24V) source terminal and at least two low power, low voltage (e.g., two 12V) source terminals. The switches may be solid-state switches for fast noise free reconfiguring. The switches may be configured for bi-directional voltage and current blocking capability to prevent shorts between high and low voltage source terminals. Switches configured for unidirectional voltage and current blocking may be used to minimize losses selectively.

The switches may be implemented in a single chip or in a multi-chip package. The switches may include enhancement mode silicon metal-oxide-semiconductor field-effect-transistors (MOSFETs), gallium nitride (GaN) FETs, silicon carbide (SiC) MOSFETS, insulated-gate bipolar transistors (IGBTs), and/or other switches. The switches may be in an ON state, an OFF state, or a linear operating state for impedance matching purposes. The switches may be integrated together with drivers and interlock logic to prevent short circuits between blocks, between different source terminals, and between a source terminal and a ground reference. The switches are controlled to achieve a desired capacity at each source terminal based on vehicle control module demands and status updates in the form of feedback signals from the BMS modules of the blocks.

In an embodiment, the cells are lithium battery cells, but may be other types of cells. The example of FIG. 24 is shown to illustrate a minimalistic architecture having a minimal number of blocks and switches per block to provide 48V, 12VA and 12VB outputs without a DC-to-DC converter.

FIG. 25 shows an electrode architecture of an example CAB cell 2500. The CAB cell 2500 includes battery electrodes (some of which designated 2502) and capacitor electrodes (some of which designated 2504) connected in parallel combinations. LIB anode electrodes 2506 and LIC anode electrodes 2508 are connected to a same terminal 2510. LIB cathode electrodes 2512 and LIC cathode electrodes 2514 are connected to a same terminal 2516. Each of the electrodes 2506, 2508, and 2514 may include layers of cathode materials or anode materials as described attached to centrally disposed collector foils 2520. Separators (not shown) may be disposed between adjacent pairs of the electrodes. FIG. 25 is provided as an example of a CAB cell. The CAB cells disclosed herein may have a similar architecture or a different architecture. For example, the CAB cell 2500 is shown having two terminals, but may have three or more terminals and corresponding battery and capacitor electrodes.

Example embodiments are provided so that this disclosure will be thorough, and will fully convey the scope to those who are skilled in the art. Numerous specific details are set forth such as examples of specific compositions, components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

Although the terms first, second, third, etc. may be used herein to describe various steps, elements, components, regions, layers and/or sections, these steps, elements, components, regions, layers and/or sections should not be limited by these terms, unless otherwise indicated. These terms may be only used to distinguish one step, element, component, region, layer or section from another step, element, component, region, layer or section. Terms such as "first," "second," and other numerical terms when used herein do not imply a sequence or order unless clearly indicated by the context. Thus, a first step, element, component, region, layer or section discussed below could be termed a second step, element, component, region, layer or section without departing from the teachings of the example embodiments.

Spatially or temporally relative terms, such as "before," "after," "inner," "outer," "beneath," "below," "lower," "above," "upper," and the like, may be used herein for ease of description to describe one element or feature's relationship to another element(s) or feature(s) as illustrated in the figures. Spatially or temporally relative terms may be intended to encompass different orientations of the device or system in use or operation in addition to the orientation depicted in the figures.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A capacitor-assisted battery module comprising:
a housing;
a positive terminal;
a negative terminal;
one or more capacitor-assisted battery cells disposed in the housing and comprising one or more battery terminals and one or more capacitor terminals, wherein at least one of the one or more battery terminals and the capacitor terminals is connected to the negative terminal; and
one or more first switches configured to connect the one or more capacitor terminals to the positive terminal, wherein
the positive terminal and the negative terminal are configured to output an overall voltage of the capacitor-assisted battery module, and
one of the one or more capacitor-assisted battery cells comprises at least three terminals, each of which being connected to i) the positive terminal via one of the one or more first switches, ii) the negative terminal, or iii) a terminal of another one of the one or more capacitor-assisted battery cells, wherein one of the at least three terminals is connected to at least one of a) a plurality of capacitor electrodes, and b) a plurality of battery electrodes.

2. The capacitor-assisted battery module of claim 1, wherein:
the one or more capacitor-assisted battery cells comprises
a lithium ion battery cathode terminal,
a lithium ion capacitor cathode terminal,
a lithium ion battery anode terminal, and
a lithium ion capacitor anode terminal;
the one or more battery terminals comprise the lithium ion battery cathode terminal and the lithium ion battery anode terminal;
the one or more capacitor terminals comprise the lithium ion capacitor cathode terminal and the lithium ion capacitor anode terminal;
the one or more first switches comprise a first switch and a second switch;
the first switch is configured to connect the lithium ion battery cathode terminal to the positive terminal; and
the second switch is configured to connect the lithium ion capacitor cathode terminal to the positive terminal.

3. The capacitor-assisted battery module of claim 2, wherein:
the one or more capacitor-assisted battery cells comprises
a second lithium ion battery cathode terminal,
a second lithium ion capacitor cathode terminal,
a second lithium ion battery anode terminal, and
a second lithium ion capacitor anode terminal;
the one or more battery terminals comprise the second lithium ion battery cathode terminal and the second lithium ion battery anode terminal;
the one or more capacitor terminals comprise the second lithium ion capacitor cathode terminal and the lithium ion capacitor anode terminal;
the one or more first switches comprise a third switch and a fourth switch;
the third switch is configured to connect the second lithium ion battery cathode terminal to the positive terminal; and
the fourth switch is configured to connect the second lithium ion capacitor cathode terminal to the positive terminal.

4. The capacitor-assisted battery module of claim 1, wherein:
the one or more capacitor assisted battery cells comprises
a lithium ion battery cathode terminal, and
a lithium ion capacitor cathode terminal;
the one or more battery terminals comprise the lithium ion battery cathode terminal;
the one or more capacitor terminals comprise the lithium ion capacitor cathode terminal;
the one or more first switches comprise a first switch; and
the first switch is configured to connect the lithium ion capacitor cathode terminal to the positive terminal.

5. The capacitor-assisted battery module of claim 4, wherein:
the one or more capacitor-assisted battery cells comprises
a second lithium ion battery cathode terminal, and
a second lithium ion capacitor cathode terminal;
the one or more battery terminals comprise the second lithium ion battery cathode terminal;
the one or more capacitor terminals comprise the second lithium ion capacitor cathode terminal;
the one or more first switches comprise a second switch; and
the second switch is configured to connect the second lithium ion capacitor cathode terminal to the positive terminal.

6. The capacitor-assisted battery module of claim 4, wherein each of the one or more capacitor-assisted battery cells includes an anode terminal shared by battery anode electrodes and capacitor anode electrodes of that capacitor assisted battery cell.

7. The capacitor-assisted battery module of claim 1, wherein the one or more capacitor-assisted battery cells includes a liquid organic electrolyte.

8. The capacitor-assisted battery module of claim 1, wherein:
the one or more capacitor-assisted battery cells include a solid-state battery cell; and
the solid-state battery cell includes a solid-state electrolyte.

9. The capacitor-assisted battery module of claim 1, wherein:
the one or more capacitor-assisted battery cells includes a hybrid type cell; and
the hybrid type cell includes a semi-liquid electrolyte.

10. The capacitor-assisted battery module of claim 1, further comprising one or more non-capacitor-assisted battery cells.

11. The capacitor-assisted battery module of claim 1, further comprising a capacitor-assisted battery terminal, wherein:
- the one or more battery terminals and the one or more capacitor terminals are cathode terminals;
- the one or more battery terminals and the capacitor-assisted battery terminal are on a first side of the housing; and
- the one or more capacitor terminals is on a second side of the housing opposite the first side.

12. The capacitor-assisted battery module of claim 11, wherein:
- the one or more capacitor-assisted battery cells include electrodes connected to the capacitor-assisted battery terminal; and
- electrodes connected to the capacitor-assisted battery terminal comprise a metal oxide and graphene.

13. The capacitor-assisted battery module of claim 1, further comprising a capacitor-assisted battery terminal, wherein:
- the one or more battery terminals and the one or more capacitor terminals are cathode terminals;
- the one or more battery terminals and the one or more capacitor terminals are on a first side of the housing; and
- the capacitor assisted battery terminal is on a second side of the housing.

14. The capacitor-assisted battery module of claim 13, wherein:
- the one or more capacitor-assisted battery cells include electrodes connected to the capacitor assisted battery terminal; and
- electrodes connected to the capacitor-assisted battery terminal comprise a metal oxide and graphene.

15. The capacitor-assisted battery module of claim 1, wherein at least one of i) the plurality of battery electrodes are connected in parallel, and ii) the plurality of capacitor electrodes are connected in parallel.

16. The capacitor-assisted battery module of claim 1, wherein:
- the plurality of battery electrodes and the plurality of capacitor electrodes are disposed in a side-by-side arrangement; and
- a plurality of anode electrodes are arranged between the plurality of battery electrodes and the plurality of capacitor electrodes.

17. The capacitor-assisted battery module of claim 1, wherein the one of the one or more capacitor-assisted battery cells comprise a first lithium ion battery terminal, a first lithium ion capacitor terminal and either i) a capacitor-assisted battery terminal, or ii) a second lithium ion battery terminal and a second lithium ion capacitor terminal.

18. A modular dynamically allocated capacity storage system comprising:
- one or more battery modules including a capacitor-assisted battery module, the capacitor-assisted battery module comprising
  - a housing,
  - a positive terminal,
  - a negative terminal,
  - one or more capacitor-assisted battery cells disposed in the housing and comprising one or more battery terminals and one or more capacitor terminals, wherein the one or more battery terminals are connected to a plurality of battery electrodes, wherein the one or more capacitor terminals are connected to a plurality of capacitor electrodes, and wherein at least one of the one or more battery terminals and the capacitor terminals is connected to the negative terminal, and
  - one or more first switches configured to connect the one or more capacitor terminals to the positive terminal, wherein the positive terminal and the negative terminal are configured to output an overall voltage of the capacitor-assisted battery module;
- one or more source terminals supplying power at a first voltage potential to a first load; and
- one or more second switches,
- wherein the one or more battery modules are configured to supply power to the one or more source terminals based on one or more states of the one or more second switches.

19. The modular dynamically allocated capacity storage system of claim 18, further comprising:
- the one or more battery modules comprising a first series of battery modules and a second series of battery modules, wherein the first series of battery modules includes the capacitor-assisted battery module;
- a first source terminal supplying power at the first voltage potential to the first load; and
- a second source terminal supplying power at a second voltage potential to a second load,
- wherein
  - the one or more second switches includes a first switch and a second switch,
  - the first series of battery modules configured to supply power to the first source terminal based on a state of the first switch, and
  - the second series of battery modules is configured to supply power to the second source terminal based on a state of the second switch.

20. The modular dynamically allocated capacity storage system of claim 18 further comprising:
- a sensing module sensing module configured to determine a parameter of the capacitor-assisted battery module and generate a status signal; and
- a control module configured to receive a power request signal, and based on the power request signal, the parameter and an operating mode, adjust a state of at least one of the one or more second switches.

* * * * *